(12) United States Patent
Hurwitz

(10) Patent No.: US 11,808,790 B2
(45) Date of Patent: *Nov. 7, 2023

(54) CONTACTLESS WIDEBAND MAGNETO-RESISTIVE CURRENT SENSOR WITH LOW ELECTROMAGNETIC INTERFERENCE

(71) Applicant: Currently, LLC, Charlotte, NC (US)

(72) Inventor: Elisa Nicole Hurwitz, Charlotte, NC (US)

(73) Assignee: Currently, LLC, Matthews, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/863,989

(22) Filed: Jul. 13, 2022

(65) Prior Publication Data

US 2023/0003768 A1    Jan. 5, 2023

Related U.S. Application Data

(63) Continuation of application No. 15/739,565, filed as application No. PCT/US2016/039292 on Jun. 24, 2016, now Pat. No. 11,422,164.

(60) Provisional application No. 62/344,712, filed on Jun. 2, 2016, provisional application No. 62/254,473, filed on Nov. 12, 2015, provisional application No. 62/184,040, filed on Jun. 24, 2015.

(51) Int. Cl.
*G01R 15/20* (2006.01)
*G01R 15/18* (2006.01)
*H05K 9/00* (2006.01)

(52) U.S. Cl.
CPC ......... *G01R 15/205* (2013.01); *G01R 15/181* (2013.01); *G01R 15/202* (2013.01); *G01R 15/207* (2013.01); *H05K 9/0088* (2013.01)

(58) Field of Classification Search
CPC ...... G01R 15/20; G01R 15/205; G01R 15/18; G01R 15/181; G01R 15/202; G01R 15/207; H05K 9/0088
See application file for complete search history.

(56) References Cited

U.S. PATENT DOCUMENTS

| | | | | |
|---|---|---|---|---|
| 6,812,687 | B1 * | 11/2004 | Ohtsuka | G01R 15/202 257/E43.003 |
| 7,642,768 | B1 * | 1/2010 | Kinzel | G01R 33/091 324/127 |
| 8,760,149 | B2 * | 6/2014 | Ausserlechner | G01R 15/207 324/251 |

(Continued)

FOREIGN PATENT DOCUMENTS

JP    3186356 U  * 10/2013

*Primary Examiner* — Son T Le
(74) *Attorney, Agent, or Firm* — Nixon & Vanderhye PC

(57) ABSTRACT

A technique for an AMR-based sensing circuit allows current measurements over a wide frequency range. This is accomplished by folding the current carrying trace around the AMR sensor to concentrate and normalize the magnetic field generated by the current over a wide frequency range. Experimental results show that the sensor, when implemented with the proposed method, has an improved bandwidth of >10 MHz and enhanced sensitivity to high frequency currents evinced by the sensor output at DC or lower frequencies. The method is applicable for example in high frequency power converters where inductor current is used to control the ripple and transient response.

13 Claims, 24 Drawing Sheets

Circuit diagram of the set-up for testing the AMR sensing scheme.

(56) References Cited

U.S. PATENT DOCUMENTS

| | | | |
|---|---|---|---|
| 2002/0047701 A1* | 4/2002 | Kawase | G01R 15/20 324/117 R |
| 2015/0185255 A1* | 7/2015 | Eaton | G01N 24/10 324/316 |
| 2019/0207516 A1* | 7/2019 | Nogawa | H02M 3/156 |

* cited by examiner

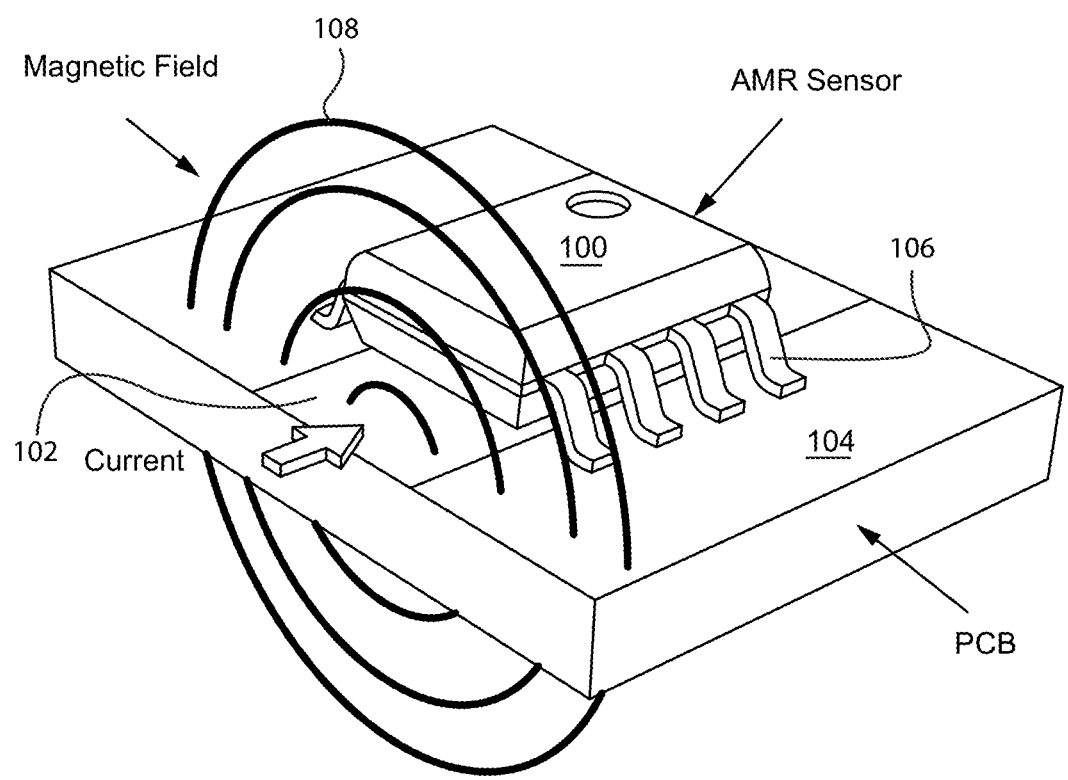
Fig. 1. General layout, i.e. "standard configuration" of AMR sensor for current measurement.

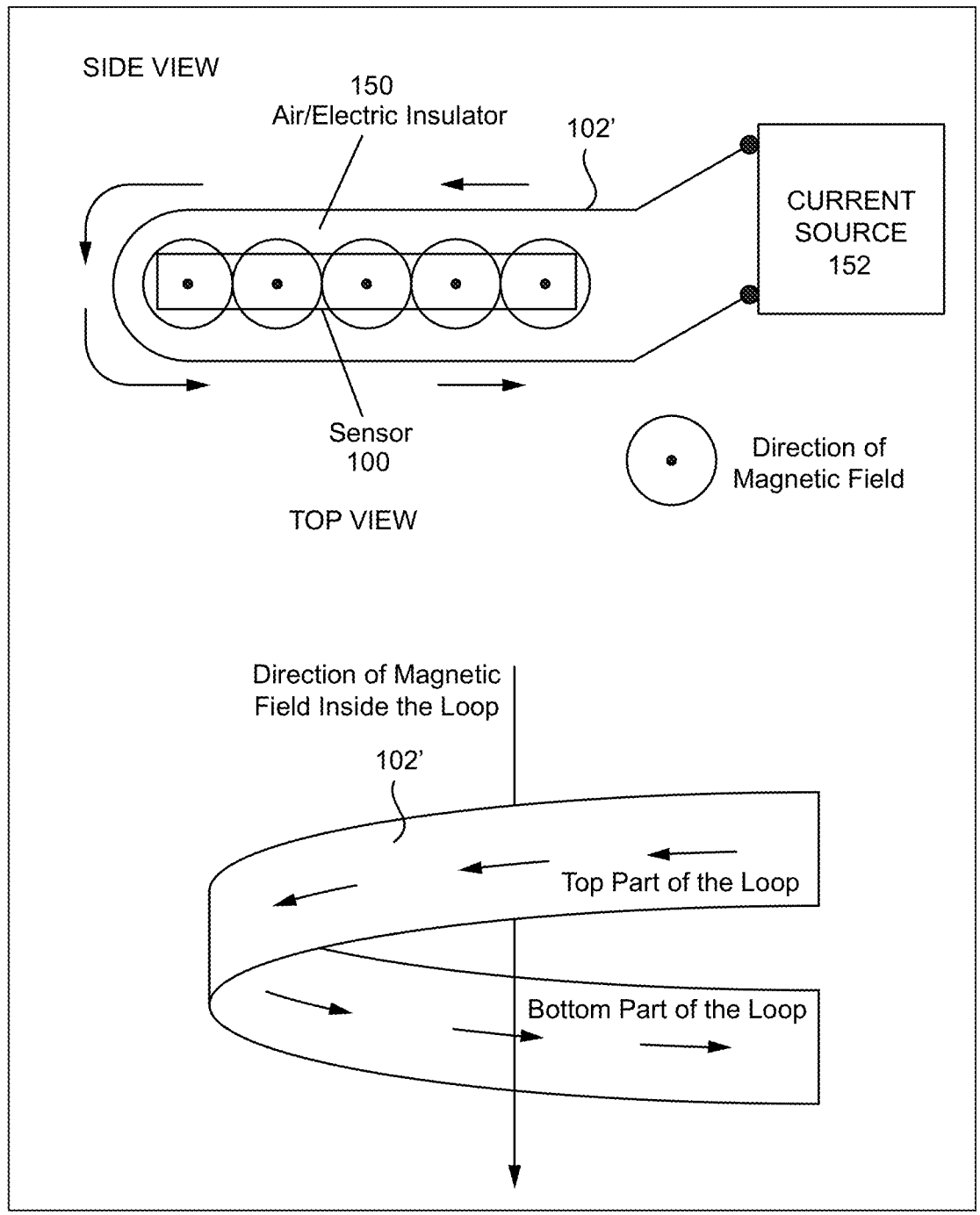
Fig. 2. Proposed folded trace technique to normalize and intensify the field.

TOP VIEW

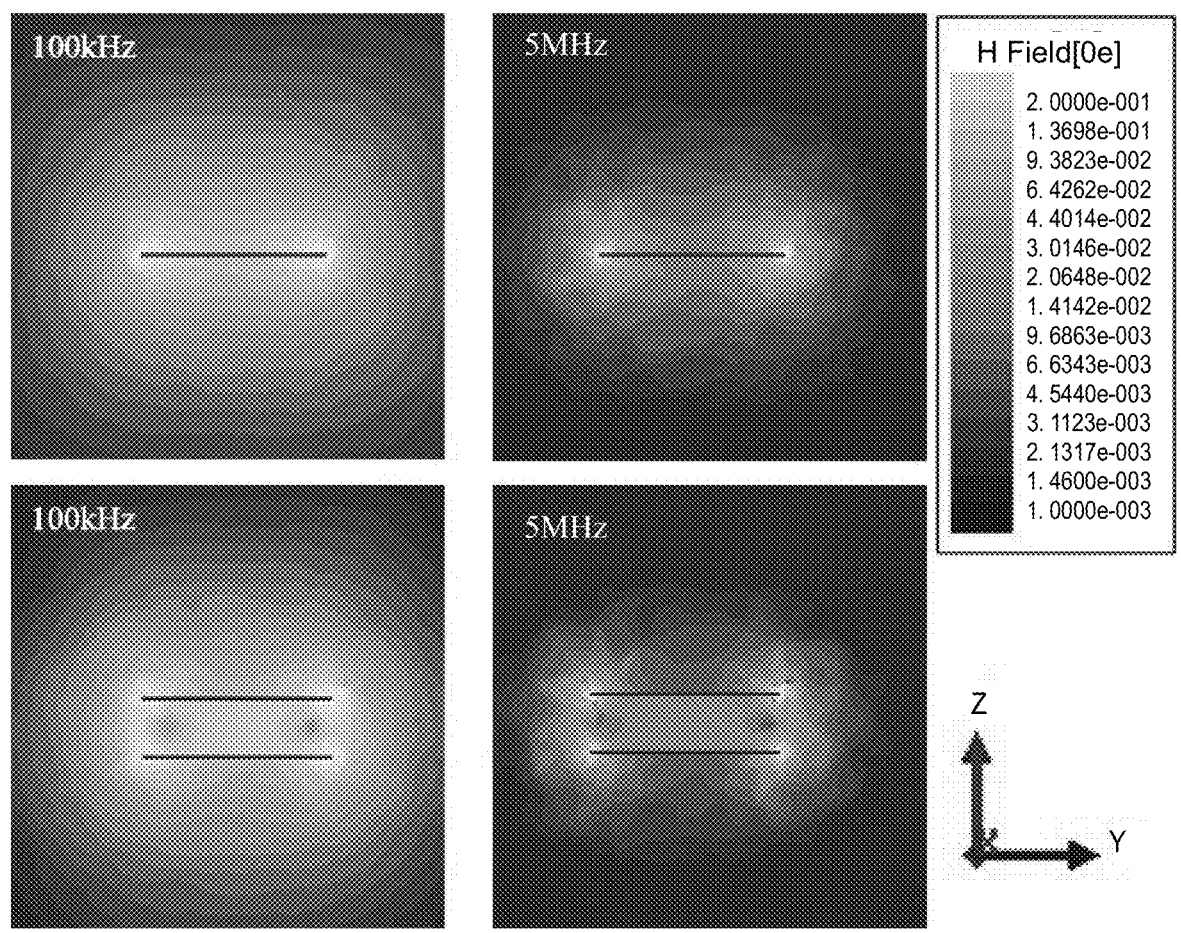
Fig. 5. Simulation results: magnetic field distribution of bare trace (top and folded trace (bottom) at two different frequencies.

Sensor element (type a shown, b has stripes on opposite diagonals)

Type a: +field makes M and I less aligned

Type b: +field makes M and I more aligned

Applied field creates $+V_S$ Across sensor bridge

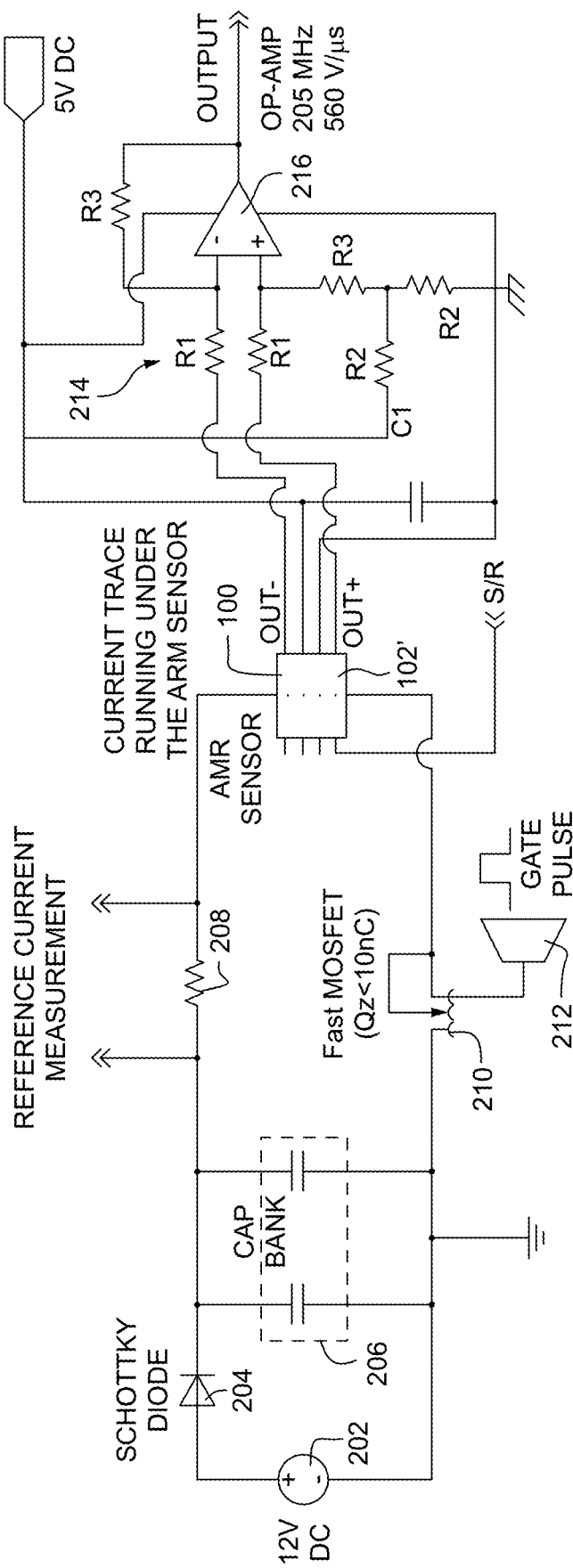
Fig. 10. Circuit diagram of the set-up for testing the AMR sensing scheme.

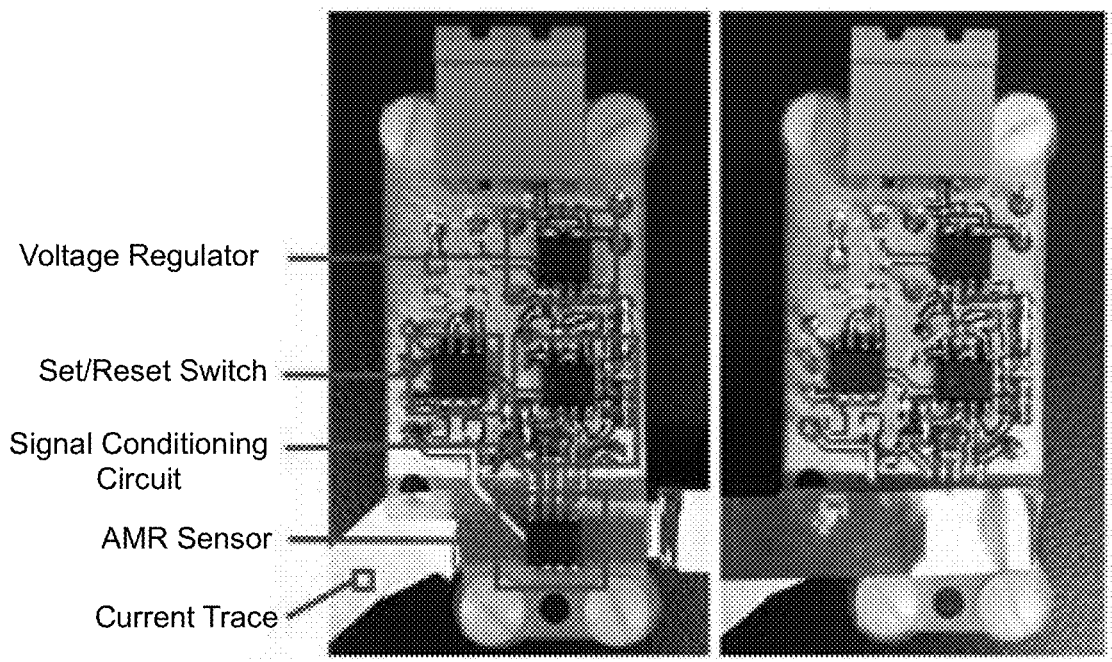
Fig. 11. Hardware setup for evaluation of the AMR current sensor. Left: standard scheme, Right: sensing scheme with the folded trace technique.

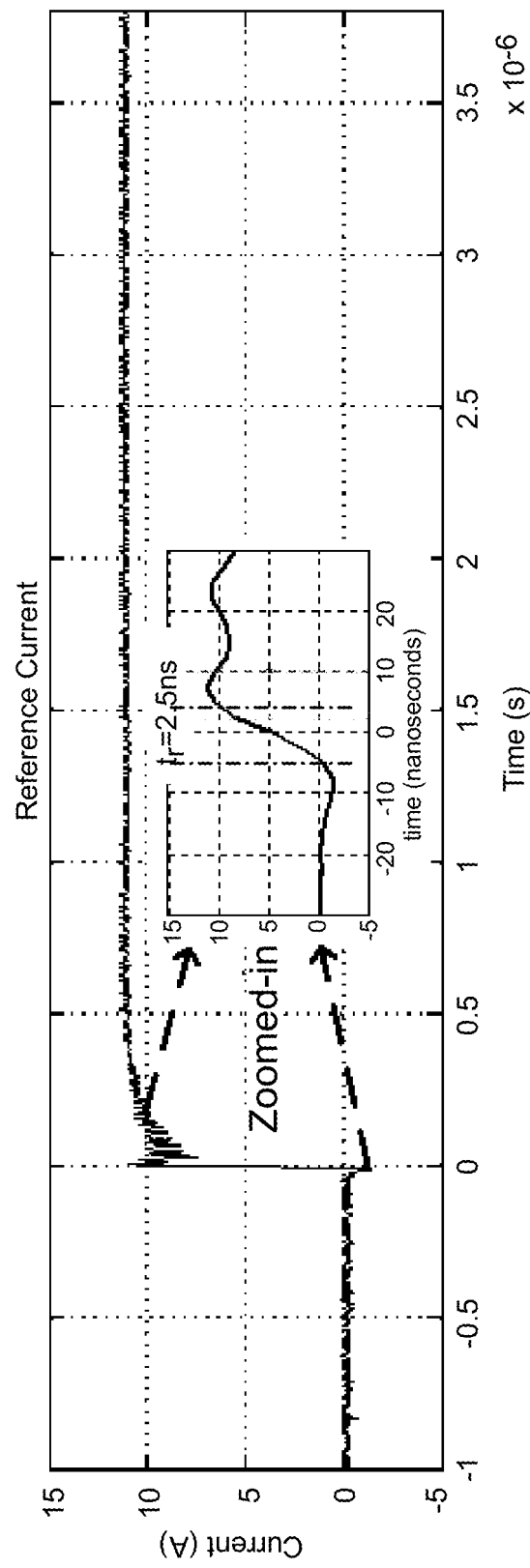
Fig. 12. Experimental measurement of step-function current which induces the magnetic field in the current trace.

CONTACTLESS WIDEBAND MAGNETO-RESISTIVE CURRENT SENSOR WITH LOW ELECTROMAGNETIC INTERFERENCE

CROSS-REFERENCE TO RELATED APPLICATIONS

This application is a continuation of U.S. patent application Ser. No. 15/739,565 filed Dec. 22, 2017, now U.S. Pat. No. 11,422,164, which is a U.S. national phase of International Application No. PCT/US2016/039292 filed Jun. 24, 2016, which claims the benefit of U.S. Provisional Patent Application Nos. 62/184,040, 62/254,473, and 62/344,712 filed Jun. 24, 2015, Nov. 12, 2015, and Jun. 2, 2016, respectively. These applications are incorporated herein by reference in their entirety as if expressly set forth.

STATEMENT REGARDING FEDERALLY SPONSORED RESEARCH OR DEVELOPMENT

None.

FIELD

The technology herein relates to integrated wideband current sensors with magnetic shields and concentrators, and more particularly to reducing electromagnetic interference (EMI) between current traces in magneto-resistive (MR) current monitoring sensors. It can also be applied to other types of magnetic field sensors, such as Hall-effect or inductive sensing sensors to enhance the response. The components of the technology may be modified to be used as linear, angular, or rotational magnetic position sensors with faster response to changes in the magnetic field induced by a current and less susceptibility to EMI.

BACKGROUND

There are a variety of magnetic sensing technologies, including reed switch sensors, inductive sensors, Hall-effect sensors, fluxgate sensors, and different classes of magnetoresistors. For current detection, inductive, Hall-effect, and magnetoresistive sensors are often most suitable. Whereas inductive methods can only detect alternating current (AC) fields, Hall-effect and magnetoresistive devices can detect both direct current (DC) and AC fields. Hall-effect sensors are made of semiconductors, but magnetoresistive (MR) sensors can be fabricated from semiconductors and metal alloys—which permits both the conductivity and the sensitivity to be tailored to the application.

The increased flexibility in design of MR sensors has led to the evolution of different types of magnetoresistive elements including, for example, magnetoresistive (MR), anisotropic magnetoresistive (AMR), giant magnetoresistive (GMR), colossal magneto-resistive (CMR), and tunneling magneto-resistive (TMR). The difference between these types of magnetoresistive elements lies predominantly in their sensitivity to magnetic fields and the linearity of their response. Whereas MRs and AMRs generally display a more linear response and little to no hysteresis compared to GMRs, CMRs, and TMRs, they are also generally less sensitive. The increased sensitivity to magnetic field of GMRs, CMRs, and TMRs comes with several potential disadvantages, including higher instability with change in temperature (high TCR), higher resistance, and hysteresis. Consequently, the focus has often returned to MRs and AMRs when the need for current sensing and measurement technology has arisen.

When electricity flows through a conductor, the amount of electron flow is called "current." Oersted discovered in 1820 that the flow of current through a conductor produces a magnetic field, and that the strength of the magnetic field produced depends on the amount of current flow. Because of this effect, it is possible to measure the amount of current flowing through a conductor by measuring the strength of the magnetic field the current flow produces. Additionally, parallel current-carrying conductors or traces (especially those carrying high current levels) can introduce interference in one another. Not only that, but switching or other components near the current-carrying conductor can introduce electromagnetic interference in the conductor or in sensors measuring current flowing through the conductor. Since information relating to electrical current is often used as a parameter for control, diagnostic, and prognostic purposes, it is helpful to reduce such interference.

The strength of a magnetic or electromagnetic field decreases exponentially with distance. Therefore, in many applications, it is possible to achieve acceptable interference levels by careful circuit trace layout. But this is not always possible with increasingly miniaturized, higher power applications. Miniaturizing high-power electronics can cause electromagnetic interference (EMI) to occur between the current traces, the integrated circuit (IC), and various components on the circuit board. The introduction of smarter power generation devices, which include current monitoring sensors, has brought to light a challenge of high power circuit design, namely, that such EMI (some of which is generated, for example, by nearby high power switching devices) interferes with current monitoring circuitry and is detrimental to performance if not controlled.

Furthermore, it can be challenging to detect current from printed circuit board traces via their magnetic field because the field varies as a function of the geometry of the trace, distance from the trace, and the frequency of the current. Most current sensors require the current to run through the chip via a small trace where it is sensed by a magnetic field sensor, such as a Hall-effect sensor, current transducer, or a magneto-resistor. This can lead to inaccurate current measurements due to Eddy currents, which reduce the radiated magnetic field, so that the detected field does not correlate with the current that generated it.

Different integrated and lossless current sensing methods, such as series MOSFET's on-resistance and parallel current-sensing FET (sense-FET) have been proposed to deduce the switch or inductor current information. However, these approaches generally do not provide electric isolation and are typically limited to low voltage applications. Among many different types of isolated sensors, magnetic field induction-based transducers and Hall-effect sensors are among the most popular technologies, and significant performance improvements have been made over the past years.

Additionally, the concept of using magnetic concentrators as a method of increasing the sensitivity of devices has been established for Hall-effect based devices using ferromagnetic materials. See P. M. DrIjaca, F. Vincent, P. Besse, and R. S. Popovic, "Design of planar magnetic concentrators for high sensitivity Hall devices," *Journal of Sensors and Actuators A*, Vol. 97-98, pp 10-14, April, 2002, and R. S. Popovic, Z. Randjelovic, and D. Manic, "Integrated Hall-effect magnetic sensors," *Journal of Sensors and Actuators A*, Vol. 91, pp 46-50, June, 2001, both incorporated herein by reference.

Typically the sensors that are sensitive to low fields at low frequency become saturated when the frequency is increased beyond the frequency cut-off of the sensor. Sensors that can detect high-frequency magnetic fields often fail at low frequencies. Currently, state-of-the-art current sensors operate at a maximum of 2 MHz (e.g., Sensitec GmbH, CMS3000). Typical Si-based Hall sensors have bandwidth limited to only tens of kilohertz, and they also have a delayed response which could cause the sensor to completely miss the signal or the transient pulse/overcurrent to be detected, or detect it after it has risen above the minimum damage threshold of the device. As Hall sensors are made from semiconductors, they inherently have a capacitance C and a resistance R. The delay in response in roughly proportional to ~1/(RC). This delay limits the maximum frequency signal it can detect. Using materials with higher carrier mobility than Si, such as GaAs and InAs, allows the element's thickness to be reduced while increasing its sensitivity and ability to detect faster transients—up to e.g., 1 MHz. However, GaAs and InAs are relatively narrowband materials and are, therefore, more susceptible to thermal noise. The thinner these materials are, the more vulnerable they are to thermal noise, and below a certain thickness their bandgap also decreases, exacerbating the problem. If the carrier mobility increases beyond a certain limit, the device becomes oversensitive to everything, reducing its ability to discriminate in favor of the signal it is supposed to detect. This also limits the bandwidth of the detector. Due to the emergence of high frequency power converters (>1 MHz), there is a need to develop other methods to detect such high frequency currents.

Several research groups are investigating techniques to improve the sensitivity and accuracy of current sensing by Hall-effect as well as magnetoresistive (MR) and giant magnetoresistance (GMR) based devices for power electronics applications. Hall-effect and magnetoresistive devices can detect both DC and AC fields. Whereas Hall-effect sensors are made of semiconductors, magnetoresistive sensors can be fabricated from both semiconductors and metal alloys. While MRs are based on low bandgap semiconductors, such as InSb and InAs, anisotropic magnetoresistive devices (AMRs) are based on metal alloys. This permits conductivity and sensitivity to be tailored precisely to the application. In contrast to Hall-effect sensors, magnetoresistive sensors do not suffer from drift and are less susceptible to external noise, increasing their utility for application in high frequency power electronics. A widely used AMR device developed and integrated into a chip is composed of four Permalloy (Ni0.81Fe0.19) AMRs in a full sensitivity Wheatstone bridge configuration. This product was initially designed for application in rotary encoders.

In 1857, W. Thomson discovered the anisotropic magnetoresistive effect in Ni and Fe. But only a century later was an alloy made of precisely these materials integrated into a memory device. In 1975, Maguire and Potter explained the AMR effect of ferromagnetic metals taking into account spin orbit coupling and d-band splitting. As material growth techniques and new analysis techniques improved, previously studied materials were revisited and new materials were explored in terms of magnetic response. As new materials were explored, the theory evolved as well, culminating in the discovery of density functional theory by Walter Kohn, for which he was awarded the Nobel Prize in 1998. This new theory modeled and predicted accurately many of the magnetic properties of bulk ferromagnetic materials, the strong enhancement of both spin and orbital moments in thin films, and the existence of magnetism in thin films of metals, for example copper, that are non-magnetic in bulk, when they are adjacent to a ferromagnet. But even this theory is only valid within certain limits, with small correlations, and at zero temperature. Insights into finite temperature ferromagnetism involve mean-field theory, with small fluctuations around the mean field theory taken into account with a linear approximation.

The first generation of materials explored consisted of ferromagnets and antiferromagnets. The second generation of materials explored semiconductors and oxides. Dilute semiconductors and the existence of long-lived nonequilibrium magnetization densities in nonmagnetic semiconductors were discovered. More recently, a magnetic response has been demonstrated in graphene by creating vacancies, unbalancing the spin within the lattice. Recently there has been renewed research into alternative forms of permalloy among other soft ferromagnetic materials. The new research attempts to exploit new nanostructuring techniques and multilayering with different non-magnetic metals to achieve enhanced magnetic effects. Defect engineering, or changing the contact metals, nanostructuring permalloy could further enhance its magneto-resistive properties and possibly reveal new effects.

A challenge is to develop current sensors that respond quickly, are accurate, and that do not take significant power away from the output. For example, a 0.1 MK/ shunt resistor measuring 100 A from a power trace/line dissipates 10 W of power. Moreover, the increased application of high voltage devices (>30V) using Wide-Bandgap (WBG) semiconductors in high frequency power converters (>1 MHz) typically requires isolated current sensors. For example, a significant amount of such EMI can be generated by switching components of a DC-to-DC converter. Such converters exist in nearly every power supply, for example, switching power supplies, buck-boost power supplies, and inverters commonly used for solar panels and other applications. High voltage power supplies are particularly slow, because the feedback loop is too slow to charge the capacitors quickly. EMI shielding and magnetic concentrators are options, but shielding requires space and adds cost and complexity. Additionally, the materials currently used for shielding and as magnetic concentrators are typically a type of permalloy, and these materials absorb and remove energy from the current trace/conductive element, the signal of which they are supposed to enhance. This also slows down the response time and limits the bandwidth.

To advance the understanding of how to mitigate the effects of EMI in high power electronics, including but not limited to magnetoresistive current sensors, there is a need to investigate alternative approaches and techniques to measure current.

BRIEF DESCRIPTION OF THE DRAWINGS

The following detailed description of exemplary non-limiting illustrative embodiments is to be read in conjunction with the drawings of which:

FIG. 1 shows an example non-limiting standard configuration general layout of an AMR sensor for current measurement.

FIG. 2 shows a proposed folded trace technique to normalize and intensify the field.

FIGS. 3a, 3b, 3c, 3c-1, 3d, and 3d-1 show example folded trace laminate or layers, textured, and patterned traces.

FIG. 5 shows example non-limiting qualitative simulation results including the magnetic field distribution of bare trace (top) and folded trace (bottom) at two different frequencies.

FIG. 10 shows an example non-limiting circuit diagram of a set-up for testing and/or operating the AMR sensing scheme. Some or all of these components can be included within the same integrated circuit chip or other package.

FIG. 11 shows an example non-limiting hardware setup for evaluation of the AMR current sensor. Left: standard scheme, Right: sensing scheme with the folded trace technique.

FIG. 12 shows example Experimental Results: experimental measurement of step-function current which induces the magnetic field in the current trace.

FIGS. 13*a*1, 13*a*2 present a frequency response analysis for the standard configuration for the experimental results shown in FIG. 12.

FIGS. 13*b*1, 13*b*2 present a frequency response analysis for the folded trace configuration for the experimental results shown in FIG. 12.

DETAILED DESCRIPTION OF EXAMPLE NON-LIMITING EMBODIMENTS

Example non-limiting technology herein provides techniques for an AMR-based (and other) sensing circuit that allows current measurements over a wide frequency range. This is accomplished by folding the current carrying trace around the AMR sensor to amplify and normalize the magnetic field generated by the current over a wide frequency range. At the same time, folding the trace around the sensor shields the sensor from other and stray magnetic fields. Experimental results show that the sensor, when implemented with the proposed method, has an improved bandwidth of >10 MHz and enhanced sensitivity to high frequency currents evinced by the sensor output at DC. The resulting increased uniformity of the sensed magnetic field and the additional shielding effect of the folded trace configuration is highly advantageous. The example technology is applicable, for example, in high frequency power converters where the inductor current is used to control ripple and transient response.

Figure 9:
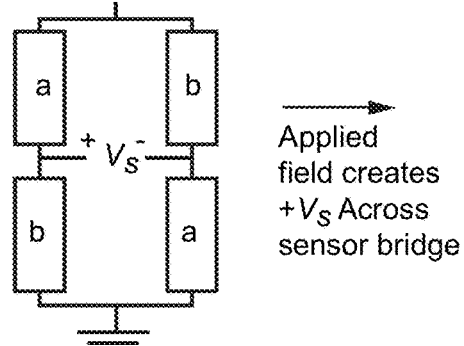
FIG. 9 shows an example Wheatstone bridge circuit.

The example non-limiting technology herein addresses these challenges as noted above by modifying the layout of the current trace with the current to be detected and combining it with a sensitive magnetic field sensor that has the potential to operate at high frequencies. By wrapping the current trace around the top and the bottom of the sensor, for illustrative purposes, a sensor composed of anisotropic magneto-resistors arranged in a Wheatstone bridge, as shown in FIG. 9, the magnetic field detected by the sensor is uniform in the frequency and field strength along the sensitive axis of the sensor. Wrapping the current trace around the top and bottom of the sensor also enhances the strength of the magnetic field and increases the speed of the sensor's response (e.g., to under 1 ns). For optimal performance the current trace should be wrapped around the top and bottom of the sensor, so that the direction of the induced magnetic field at least partially coincides with the sensitive axis or plane of the magnetic field sensor.

The folded trace may be linearly offset and/or next to the sensor parallel to the direction of the magnetic field induced by the folded trace and still direct a uniform magnetic field towards the sensor, which it may detect. This may be beneficial if the intent is to reduce the detected magnetic field strength to avoid maximum sensitivity of the sensor.

The sensor may be angularly offset along one or more of the three axes with respect to the folded trace and will detect a magnetic field, provided that the direction of the induced magnetic field at least partially coincides with the sensitive plane or axis of the sensor. This may be beneficial if the intent is to reduce the detected magnetic field strength to avoid maximum sensitivity of the sensor.

Figure 4A:
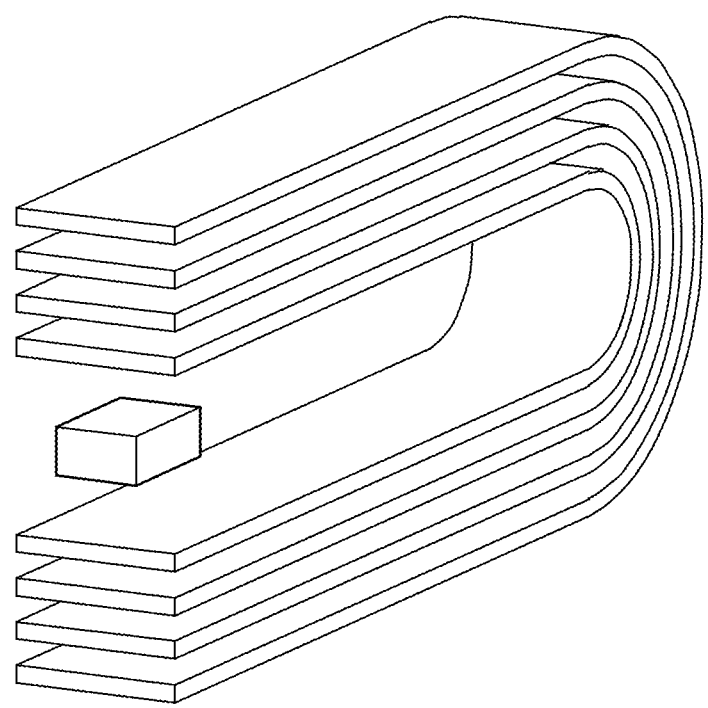
FIGS. 4*a*, 4*b*, 4*c*, 4*d*, 4*e*, and 4*f* show example alternative configurations of partially folding the trace around the sensor with various types of linear and/or angular offsets.
Figure 4B:
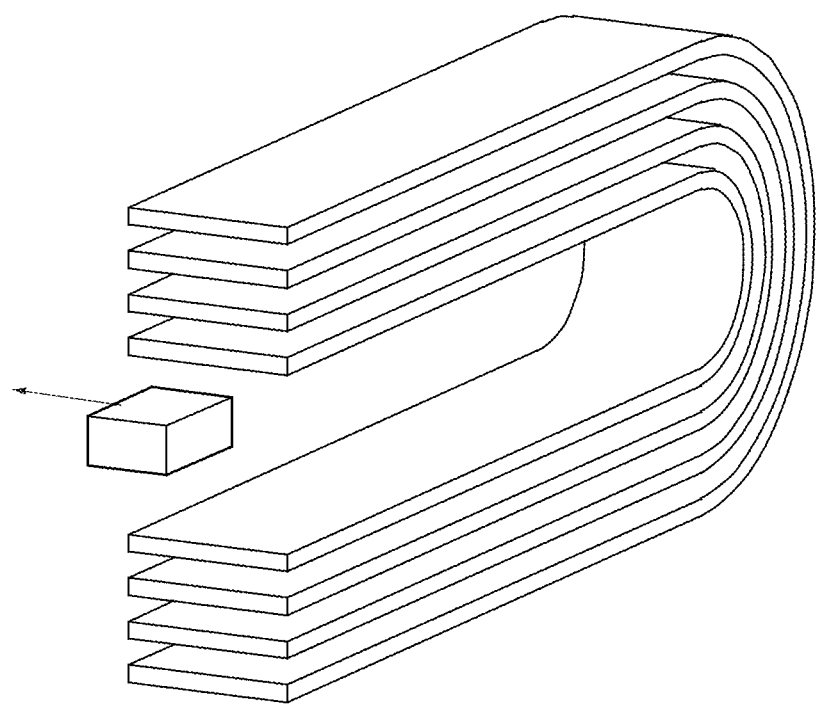
Figure 4C:
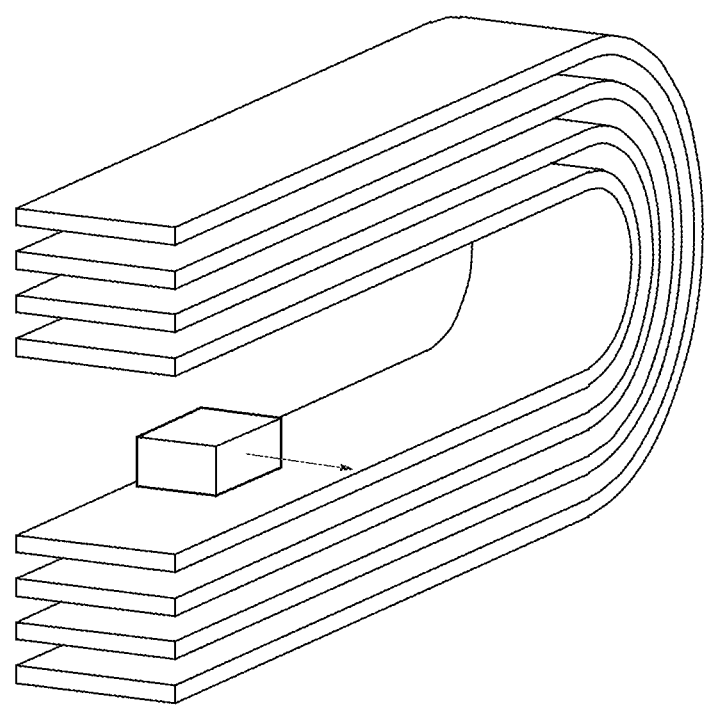
Figure 4D:
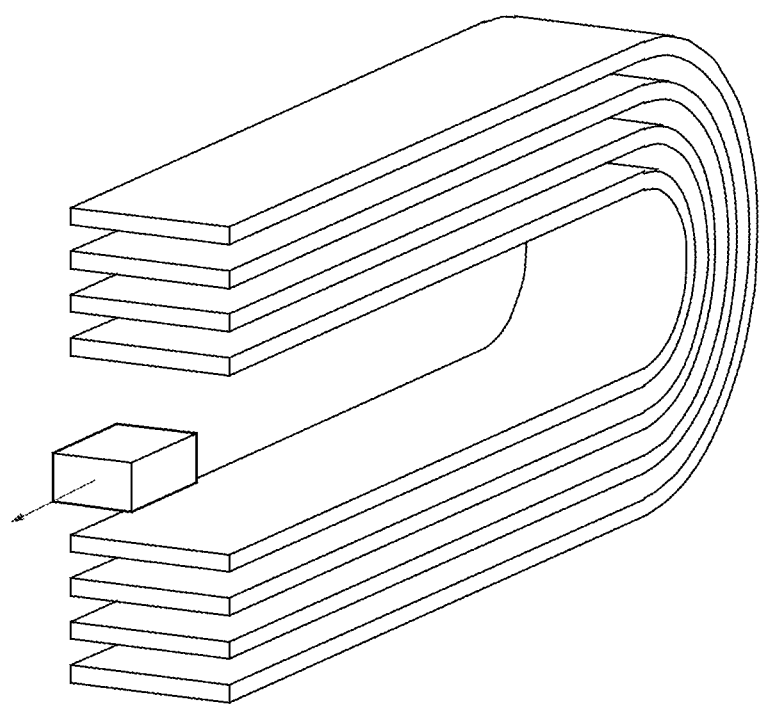
Figure 4E:
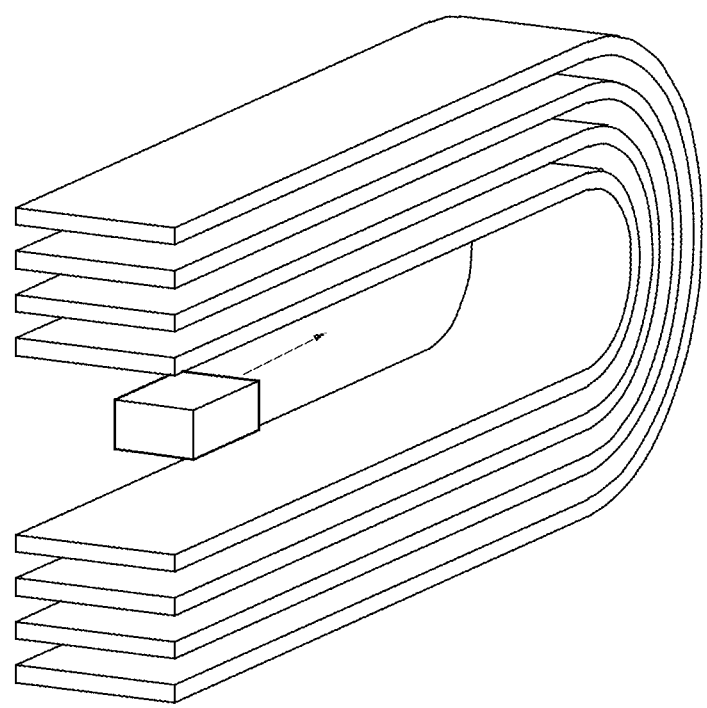
Figure 4F:
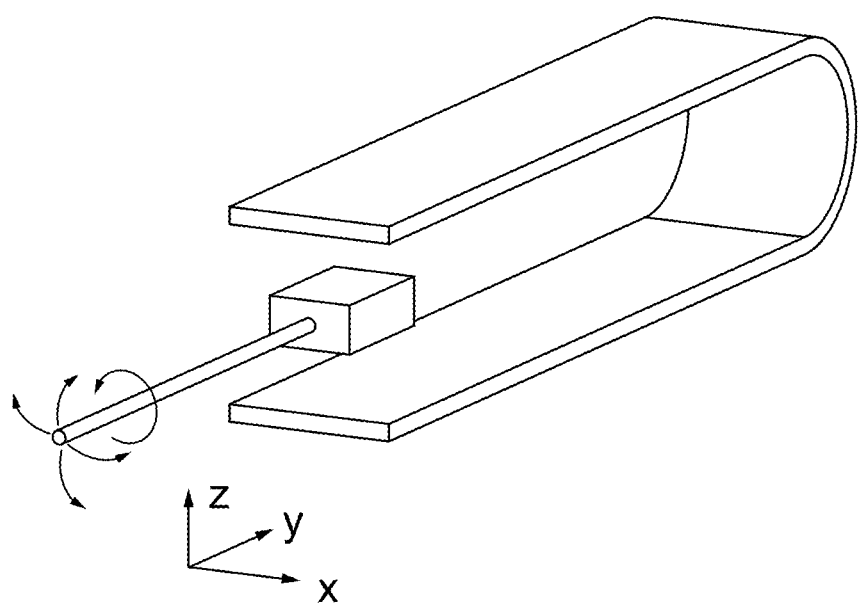

For some applications, such as current sensing, it is beneficial for the sensor to be stationary within the folded trace, whether in the optimal position, fully enveloped, or offset with respect to the folded trace. See e.g., FIG. 4*a*. For other applications, such as to create a more sensitive position or angular sensor, it may be beneficial to allow the sensor to rotate angularly or to be displaced linearly within the folded trace or next to the folded trace. See FIGS. 4*b* & 4*c* (linear displacement in the left-right axis), FIGS. 4*d* & 4*e* (linear displacement in the front-back axis), and FIG. 4*f* (rotation about any of the pitch/yaw/roll axes). Any change in position or angle of the sensor would correspond to a change in detected magnetic field. For applications in which the sensor is permitted to move within the folded trace (e.g., using the sequence of FIGS. 4*a*-4*e* as a flip chart animation), it may be advantageous for the trace not to be perfectly or entirely folded over itself, but instead be oriented at a slight angle. This would skew the vertical and horizontal spatial distribution of the field with respect to frequency and would allow for more options in moving the sensor within the folded trace.

Figure 3A:
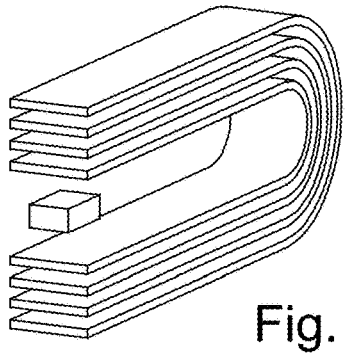
Figure 3B:
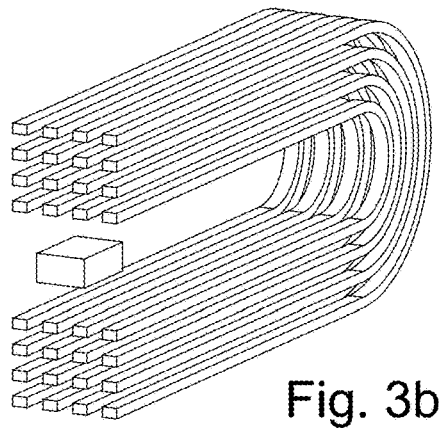
Figure 3C:
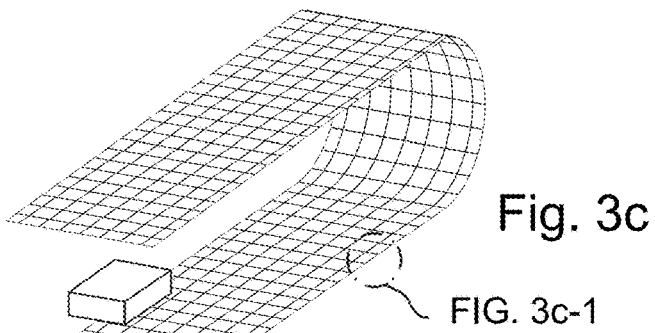
Figures 1, 3C:
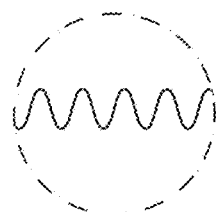
Figure 3D:
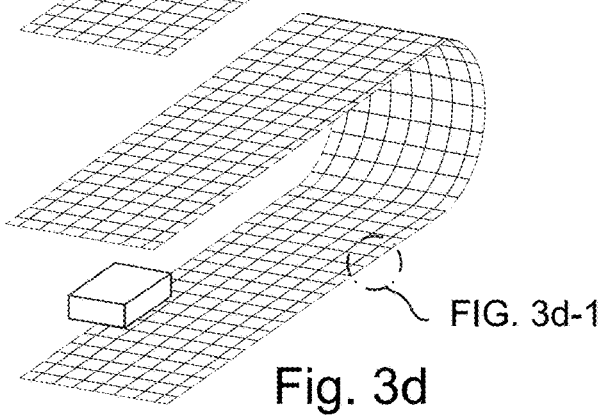
Figures 1, 3D:

The sensing element may be a Hall-sensor, current transducer, Rogowski coil, or other magnetic field sensor positioned such that the folded trace induced a field towards the magnetically sensitive part of the sensor. Although Hall sensors are limited in their response time, folding the trace would still enhance the magnitude and response time to the limit of the semiconducting material. Different configurations for the trace are also possible, as can be seen in FIGS. 3a-3d. For example, the trace may be divided into flat layers of metal separated by an insulator or an air-gap and folded around the sensing element to accommodate higher currents (see FIG. 3a). This accommodates higher currents better than a thicker folded trace because current flows along the surface of the conductor, and various structures may be designed that increase the surface area of the conductive trace. The trace may be textured to enhance or limit certain frequencies. As examples, the trace may be a mesh (FIGS. 3c & 3c-1 showing a sinusoid-shaped mesh, and FIGS. 3d & 3d-1 showing a zig-zag-shaped mesh) or consist of several parallel wires (one or several layers, such as shown in FIG. 3b) that are wrapped around the sensing element.

The sensor may be attached to a signal processing circuit to amplify the signal and compensate for any offsets. In some non-limiting illustrative embodiments of the present, the sensor, current trace and signal processing circuit may be integrated into a chip with two input wide pins for the current trace, one reset signal, the input power and GND, and the output voltage signal, which can be read by a microcontroller or similar microprocessor. For example, an AMR with wraparound trace can be integrated into a chip or otherwise with a comparator circuit providing a gain adjust using different programming resistors or other components to program the gain.

In another alternative non-limiting configuration the magnetic field can be concentrated by combining a conductive metal linked to reference ground with a sensitive magnetic field sensor that has the potential to operate at high frequencies such that the conductive material reflects the magnetic field back onto the magnetic sensor, enhancing the field detected by the sensor and increasing the speed of the sensor's response.

The sensor may be attached to a signal processing circuit to amplify the signal and compensate for any offsets. In some illustrative embodiments, the sensor, reflective shield, current trace and signal processing circuit may be integrated into a chip with two input wide pins for the current trace, one reset signal, the input power and GND, and the output voltage signal, which could be read by a microcontroller or similar microprocessor.

Example non-limiting embodiments will now be described more fully hereinafter in the following detailed description, in which some, but not all non-limiting embodiments are described. Indeed, the example non-limiting technology may be embodied in many different forms and should not be construed as limited to the embodiments set forth herein; rather, these embodiments are provided so that this disclosure will satisfy applicable legal requirements.

In a general power electronic application, the MR-based current sensor is placed on top and/or underneath a printed circuit board trace carrying the current without any conductive contact to the trace. FIG. 1 shows an example non-limiting standard configuration and layout for an AMR sensor IC 100 to measure current. The sensor 100 detects the magnetic field generated by the current carrying power PCB 104 trace 102. Details of the PCB 104 that electrically connect to pins 106 of sensor IC 100 are omitted for purposes of simplification.

When the amount of current through the trace does not exceed the maximum current recommendation and there are no thermal effects, the magnetic field is uniformly distributed around the surface of the trace for all frequencies. The higher the frequency, the shallower the penetration depth. However, when more current is forced through the trace than the material can tolerate and there is a significant temperature rise or thermal effects, the following is observed: at low frequencies, the magnetic field 108 around the trace 102 is uniformly distributed and intersects the sensor 100 along the default axis, generating a response. However, at higher frequencies, especially above 1 MHz, due to the skin effect, the current tends to flow mostly on the edges of the PCB trace 102. As a result, the generated magnetic field distribution is not uniform and is mostly concentrated around the edges. In addition, the radiated magnetic field is lower than would be expected for that amount of current. Unfortunately, the AMR current sensor 100 detects the weaker part of field distribution over the frequency of operation, giving the false impression that it loses its sensitivity at higher frequencies. Consequently, this application is typically limited to much less than 1 MHz.

In non-limiting example embodiments, normalizing the magnetic field 108 over the frequency range of interest with magnetic concentrators results in an increase in the detected bandwidth and sensitivity of the sensor. These magnetic concentrators maximize the magnetoresistive sensor 100's bandwidth.

Example non-limiting embodiments herein employ a method to increase the sensitivity and frequency bandwidth of an MR sensor 100 including but not limited to AMR sensors, enabling the detection of current with very fast transients. An example non-limited approach concentrates and normalizes the magnetic field 108 induced by the wideband current in PCB traces 102 commonly seen in power electronics applications. It is further desirable to increase the detected bandwidth of the AMR sensor 100.

Applications for the example non-limiting technology herein include for example DC-to-DC power converters, surge protectors, automotive applications (e.g., tire pressure measurement, brakes, etc.), solar panel power converters, control systems, and any other application where high speed or other current measurement is desirable, for example, to measure the current within a smart appliance, as in the Internet of Things, where nanosecond response is necessary.

The trace may also be folded around other types of magnetic field sensing devices, for example, Hall-effect elements or sensors, inductive coils, current transducers and Rogowski coils. If an appropriately wideband signal, for example, a step-function generating signal is connected to the folded trace, this setup can be used to characterize the resonant frequencies and the bandwidth of other types of magnetic sensors and inductive elements.

Method for Wideband Current Measurements Using AMR Sensors

Folded Power Trace to Normalize the Magnetic Field vs. Frequency

As discussed above, the magnetic field 108 distribution around the current trace of FIG. 1 is significantly non-uniform at high frequencies due to the skin effect. This means that point-field detectors such as AMR sensors 100 need to be placed accurately where the respective radiated magnetic field 108 can be measured uniformly over the bandwidth of interest i.e., DC-10 MHz or higher. In other words, the general scheme shown in FIG. 1 may not be advantageous for wideband current measurements.

A magnetic field concentration technique is useful for sensing the high frequency current in this context. The example non-limiting method herein addresses these challenges by modifying the layout of the current trace 102 carrying the current to be detected and combining it with a sensitive AMR sensor 100. In one non-limiting embodiment, by wrapping the current trace 102 around the top and the bottom of the AMR sensor 100, the magnetic field 108 detected by the sensor 100 becomes uniform in the frequency range of interest.

An example non-limiting method generates a much more uniform magnetic field, whose magnitude depends on the current, along the sensitive axis of the sensor 100. An example non-limiting structure is shown in FIG. 2 illustrating an example of current path around magnetic field/current sensor 100. In this example, the current carrying conductor 102' is folded so that it wraps around the top and the bottom of sensor 100. Thus, the top part of FIG. 2 shows the sensor 100 with air or other insulator 150 separating the sensor from a wrapped-around current carrying conductor 102'. Current from a current source 152 travels through the conductor 102' above and loops below sensor 100—maintaining a wide trace width, shielding and enhancing the magnetic field within the sensor. The example non-limiting method concentrates the magnetic field onto the current sensor 100 without altering the current on the trace 102' and simultaneously shields the sensor from any other stray magnetic fields, which are very commonly generated by switching power converter components that may be nearby.

In more detail, the magnetic field within the folded trace 102' is highly uniform (i.e., substantially the same field exists within the entire volume inside the folded trace—which means the sensor 100 is exposed to a highly uniform magnetic field). Moreover, since the folded trace 102' also provides a shielding effect that shields the sensor 100 from other magnetic fields generated outside of the folded trace, the sensor sees substantially only the magnetic field generated by the folded trace. Furthermore, the folded trace design shown in FIG. 2 provides improvements in the speed performance of the sensor 100, which can be important in real time current sensing applications such as in power converters.

Figure 2A:
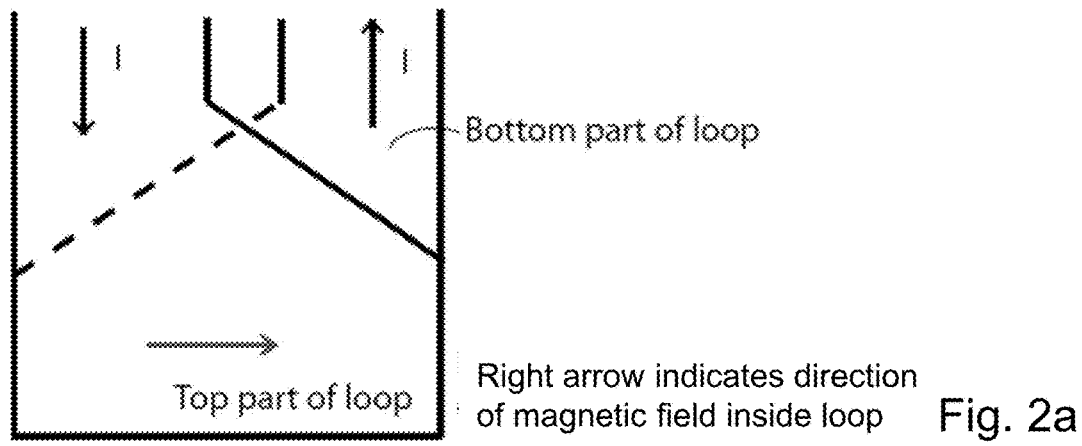
FIG. 2a shows a schematic view of the FIG. 2 arrangement.

The folded or wrapped conductor 102' could be configured in various ways. For example, in some applications the conductor is a strip of copper or other conductor. In other applications, it may be a textured metal or even a cage. Textured metal could enhance performance by focusing more deeply and might even be used to filter frequencies the sensor 100 is exposed to. Thus, a customized conductor design could be used to emphasize certain frequencies over others in certain applications, whereas in other applications a frequency response is provided that is as flat as possible. For higher current applications, it is possible to use a thicker copper trace and fold it around the sensing element. However, to carry higher currents, several thin copper traces laminated together in parallel with an insulator or air gap in between could also be folded around the sensing element, provided that the parallel conductors are joined at the input and at the output. This configuration would increase the amount of current that could be carried by the copper traces in parallel and allow each layer to radiate a strong magnetic field into the sensing element without interfering with each other (see FIG. 2b). Alternative structures that increase the surface area include but are not limited to a mesh, a layered two-dimensional array of strips or wires and conductor—insulator sandwiches.

To better understand the distribution of magnetic field around the bare trace 102 and the proposed folded trace 102', a set of simulations are provided using a full-wave commercial electromagnetic solver, Ansys HFSS. The simulations include copper traces with dimensions of 10 mm and 5 mm along the X and Y axes, respectively, and with a thickness of 35 µm (equivalent to 1 Oz copper) along the Z-axis. The folded trace technique can be implemented, for example, with 1.5 mm gap between the two traces. FIG. 5 presents the FEM simulation results for the bare and folded trace cases. By increasing the current's frequency from 100 kHz to 5 MHz, a much more uniform magnetic field distribution is obtained around the trace with the folded trace technique compared to the bare trace case. The difference in magnetic field distribution for 5 MHz frequency is visible in the top-right and bottom-right figures in FIG. 5. The field distribution in between the two traces for the bottom-right figure is much more uniform compared to the one with only a single bare trace.

The simulation study is further carried out considering the relative position of the sensing element on top of the current trace. In this study, measurements have been taken for different positions around the trace going from the middle of the trace toward the edges where the magnetic field has the highest intensity, but is scattered and non-uniform. Consequently, the area from the middle of the trace to around ⅔ of the distance toward the edge is the area that has a positive effect on the sensitivity of the sensor. The proposed folded trace method has an overall improved magnetic flux distribution in terms of uniformity and intensity.

Some Information Concerning Anisotropic Magnetoresistive Sensors of the Disclosed Non-Limiting Embodiments As discussed above, while MRs are based on low bandgap semiconductors, for example, InSb and InAs, AMRs are based on metal alloys. Research has focused on developing materials with a superior detection sensitivity range, leading to the discovery of the GMR, CMR, and TMR. As a result, today's commercial current sensors still use that technology as the primary method to detect current via its magnetic field and integrate with signal conditioning circuits. However, even the best currently-available commercial permalloy-based AMR current sensor is limited to a 2 MHz frequency bandwidth and requires a specific change in layout to operate. Generally, there is a trade-off between sensitivity and frequency bandwidth, which strongly depends on the type of material used.

Figure 6:
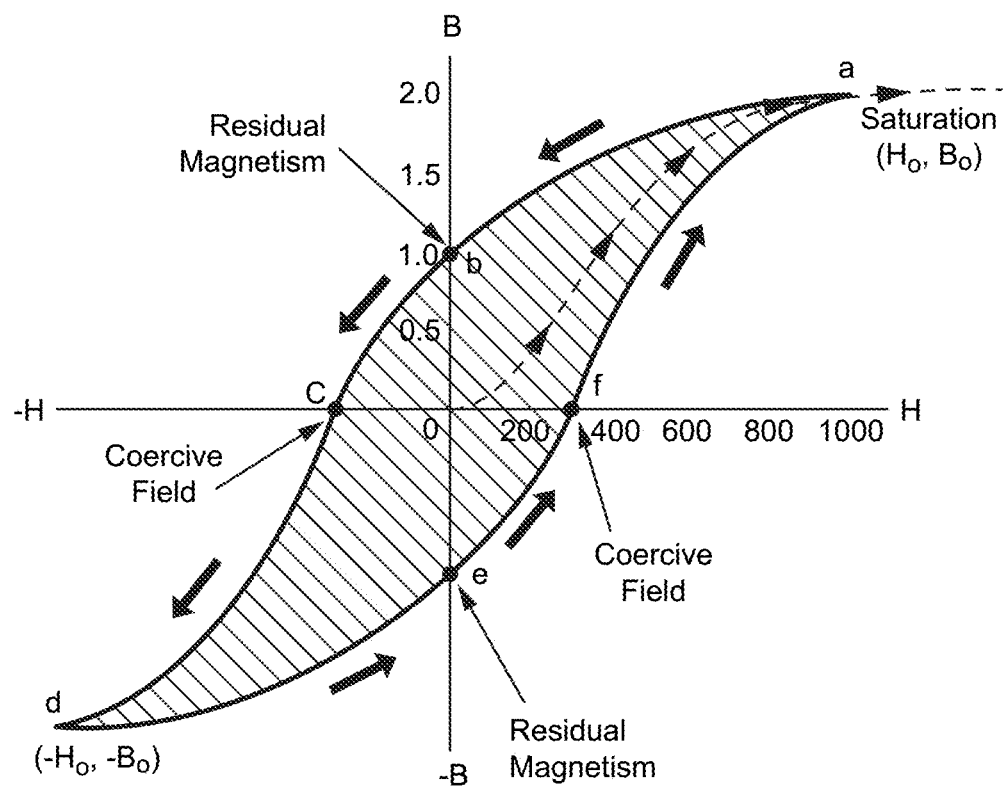
FIG. 6 shows a typical hysteresis curve of a ferromagnetic material.
Figure 7:
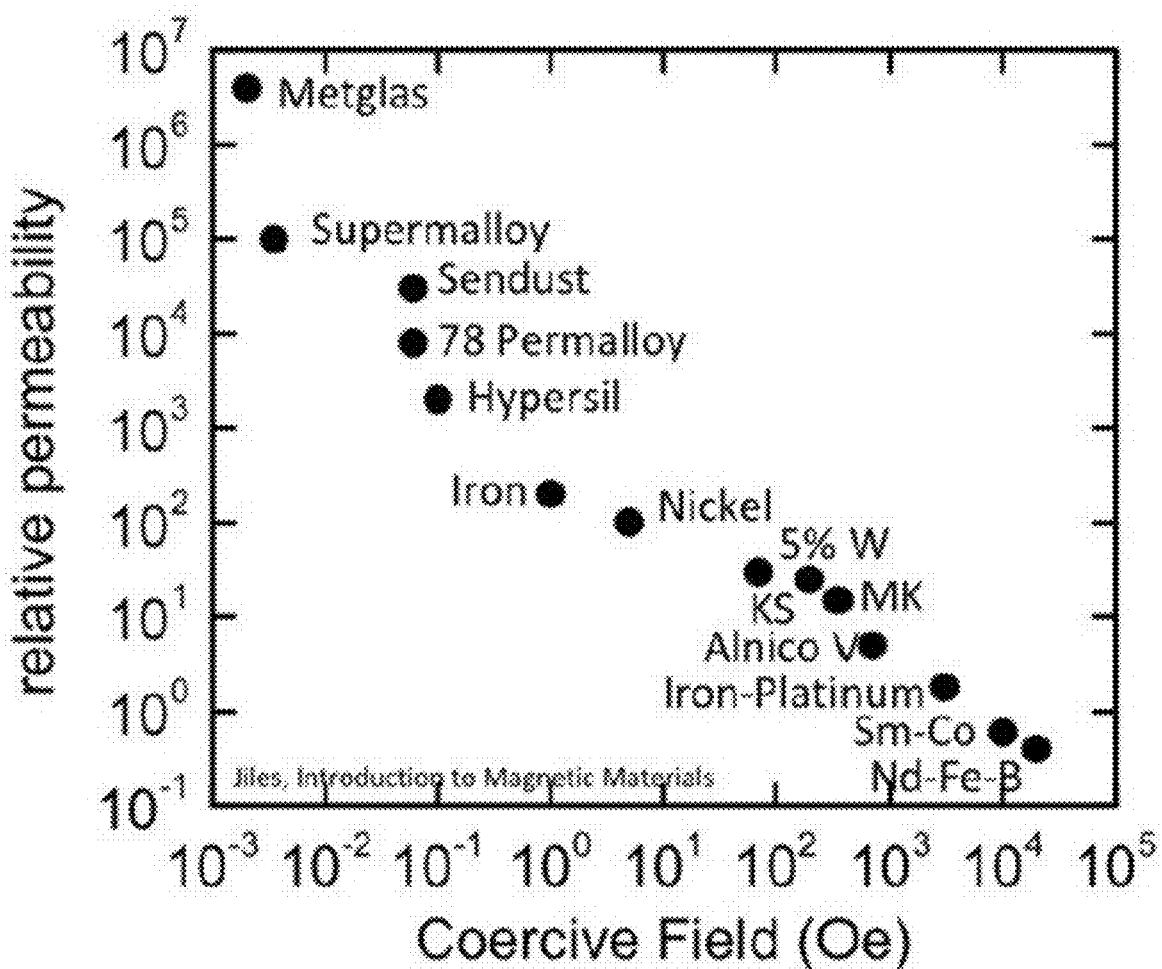
FIG. 7 shows a relative permeability/coercive field plot for various materials.

To understand how the resistance of an AMR element depends on the magnetic field, it is helpful to understand some properties of anisotropic ferromagnetic materials. The magnetic response of an anisotropic ferromagnetic material depends on the direction of the applied magnetic field with respect to the material's crystal lattice. When the applied field aligns all of the dipoles in the ferromagnetic material in the same direction, the material is said to have reached the saturation magnetization, i.e., further increasing the applied magnetic field does not elicit an increase in magnetization of the material. See FIG. 6, which shows a typical hysteresis curve of a ferromagnetic material. The x-axis shows the value of the applied field H, and the y-axis shows the value of the field measured across a ferromagnetic material. When there is no applied field, the dipoles are randomly oriented, and the magnetization is zero (FIG. 6, point 0). As the field is increased, the dipoles are aligned until the saturation magnetization is reached (FIG. 6, point a). When the field is decreased to reduce the magnetization at zero H field, there is still a residual B field (FIG. 6, point b). Therefore the applied field must be decreased until the ferromagnetic material is demagnetized (FIG. 6, point c). The value of this applied field is called the "coercive field" of the ferromagnetic material. Thus, to demagnetize the material, the applied field must be reduced to a value below zero. As the applied field is further reduced, it eventually reaches a negative saturation magnetization (FIG. 6, point d). When the applied field is now increased the magnetic field across the ferromagnetic material is lower than it was when it was reduced, and at zero applied H field, there is a negative residual B-field in the ferromagnetic material (FIG. 6, point e). To achieve a zero B-field in the ferromagnetic material, the applied field must be increased to the positive value of the coercive field (FIG. 6, point. f). The value of the coercive field determines how wide the hysteresis is. Interestingly, materials with high permeability have low coercive fields. FIG. 7 thus shows relative permeability vs. the coercive field for various materials. As can be seen, materials with high permeability have lower coercive fields, which means that they exhibit a less pronounced hysteresis. See Jiles, David, Introduction to Magnetism and Magnetic Materials, 3d Ed. (CRC Press 2016).

The natural zero energy orientation state of the material is defined as the easy axis, and therefore, a relatively small applied magnetic field will reach the saturation magnetization of the material along this direction. In contrast, along the hard axis a substantially larger magnetic field is necessary to reach the saturation magnetization. It is no coincidence, then, that the easy axis is along the direction with the lowest atom density and that the hard axis is along the direction of the highest atom density. The direction of current flow in a material is controlled by the location of the contacts across which a voltage is applied. If the material is designed such that contacts are at an angle to the easy axis, and initially when no field is present the magnetization is oriented along the easy axis, the conduction path is the shortest distance between the contacts.

Figure 8:
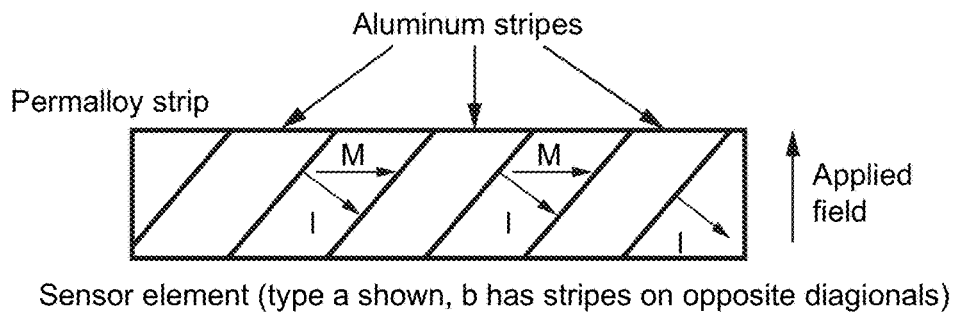
FIG. 8 shows an example Permalloy strip with aluminum contacts.

FIG. 8 shows a Permalloy strip with aluminum contacts, typically used in a Wheatstone bridge (as in FIG. 9). M and I are shown in their default directions when no magnetic field is applied. M is aligned with the easy axis, and I is directed along the shortest distance between the A1 strips. In the type of AMR shown (type a), the applied field forces the angle between M and I to increase, decreasing the resistance. If the A1 strips are placed along opposite diagonals (mirror-imaged along the vertical axis), the applied field reduces the angle between M and I, increasing the resistance (type b). By combining both types of AMR elements in a Wheatstone bridge, such that one output produces the sum of the resistances induced by the magnetic field, and the other so that the resistances compensate for each other, the output can be further amplified.

By applying a magnetic field in the plane defined by the easy axis and the distance between the electrical contacts, which is perpendicular to the easy axis, the magnetization is rotated from the easy axis towards the direction of current flow, in effect changing the orientation of dipoles and increasing the current path. This increase in current path translates into an increase in resistance in the material as a function of the applied magnetic field. When the magnetization is aligned with the direction of current flow, defined by the location of the contacts, the resistance reaches its maximum value. The alignment of the easy axis to the plane where the contacts are deposited is determined by the orientation of the substrate on which the ferromagnetic material is grown. Using metal alloy instead of a semiconductor to adjust the resistance as a function of the applied magnetic field, largely reduces the hysteresis and increases the response time. In summary, by appropriate selection of the substrate and metal alloy, the sensitivity to the magnetic field and response time can be tailored to the application.

An accurate theoretical model of magnetoresistive film as applied to permalloy begins by applying the basic tensor relationships to model the effect of a transverse field on individual AMR elements and solving the minimum energy equation, resulting in $$\Delta\theta = \frac{MH}{2K_u}\cos\theta \tag{1}$$

where M is the magnetization, H is the applied field, $K_n$ is the anisotropy constant of the material, $\theta$ is the angle of the applied field, and $\Delta\theta$ is the change in angle of the magnetization which is related to the change in resistance. See Haji-Sheik, chapter 2: "Commercial Magnetic Sensors (Hall and Anisotropic Magnetoresistors), "Sensors", ed. By S. C. Mukhopadhyay, R. Y. M Huang, Springer-Verlag Berlin Heidelberg, 2008, incorporated herein by reference. The change in angle is related to the resistivity, where one part is due to the isotropic portion of the resistivity and the other component is due to the magnetic portion of the resistivity. By relating the resistivity equation to the electric field and eventually the voltage, a relationship between the voltage, the change in resistivity, and the angle of incidence of the applied field is established:

$$V_{tot} = I_S R_0 \left( A + B\left((1 + C\cos 2\theta)^2 + (C\sin 2\theta)^2\right)^{\frac{1}{2}} \right) \tag{2}$$

This equation cannot be calculated directly and precise measurements of the change in magnetoresistance vs magnetization angle are required. The resulting data is then compared to the equation, and the constants are adjusted to obtain a fit.

Experimental Verification

To examine the performance of the AMR-based current sensor, several circuits were designed and implemented. FIG. 10 presents an example non-limiting circuit diagram of a hardware setup designed to evaluate performance. In this circuit, a 12 VDC supply 202 powers a step function generator including a high-speed Schottky diode 204 and a capacitive bank 206 and a resistor 206. A fast MOSFET 210 controlled by a gate pulse generator 212 switches the current to the AMR sensor 100 with folded current trace 102' as shown above. The AMR sensor 100 output is amplified by an op-amp 216 which generates a high frequency output. Other testing configurations are of course possible.

In more detail, to evaluate the bandwidth of the current sensor in a timely manner, a fast high-rise current step function generator was used. See U.S. Provisional Patent Application No. 62/184,050 filed Jun. 24, 2015, and commonly assigned PCT Application No. PCT/US2016/039272 filed on Jun. 24, 2016 entitled "Method and Apparatus For Generating High Current, Fast Rise Time Step-Functions" of Hurwitz, incorporated herein by reference. The step current was obtained by charging a capacitor bank and then discharging it through a small power resistor. The voltage across the resistor 208 was taken as the reference current measurement, as shown in the left side circuit in FIG. 10. Subsequently, a current sensing scheme using a commercially available AMR sensor 100 was designed and developed. The sensor output was amplified by a differential amplifier 214 with a gain of 50. The right side circuit of FIG. 10 shows the sensor and signal conditioning circuit.

FIG. 11 shows an example hardware prototype developed for the standard configuration (left) and the proposed folded trace configuration (right). The current carrying trace with 1 Oz copper is implemented on the bottom layer of the PCB with 1.5 mm thickness as shown in FIG. 11—left picture. Copper foil with 35 µm (1 Oz) thickness is used to implement the proposed folded trace covering the AMR sensor. The main signal conditioning circuit is designed with high speed components such that it does not limit the frequency range of interest. FIG. 11—right presents the picture of the hardware prototype that was fabricated to study the AMR sensor with the proposed method.

FIG. 12 presents the experimental results captured from testing with the bare/regular trace and the folded trace. Data collected from the prototype revealed that the detected voltage signal in the "folded trace" configuration is amplified compared to the "standard configuration", in which the sensor is positioned over the current trace, and responds faster to the input signal. In other words, it can be concluded that the sensor with the folded trace has an improved sensitivity compared to the standard configuration.

It is also clear from FIG. 12 that the AMR sensor in the folded trace configuration follows the reference current significantly better than in the standard configuration. During the characterization of the AMR sensor in the vicinity of a current carrying PCB trace with standard configuration, initially the sensor output appears to behave completely out of phase at very high frequencies. Based on that result, one might not expect the AMR sensor to be capable of following a very high frequency magnetic field. The sensor output is expected to behave like a first-order system. The reason for such behavior of the sensor can be explained by the FIG. 2a schematic diagram, and by the simulation results of FIG. 5, in which the current trace in the standard configuration has a non-uniform magnetic field distribution around the current trace with respect to frequency. In addition, it is important to remember that, according to Faraday's Law, the strength of an induced magnetic field is a function of the change in current over time. Therefore, a fast change in current will induce a much stronger magnetic field than a slow change in current. The stronger magnetic field will have a more pronounced effect on the dipoles of the AMR. The exciting current is in the form of a step-function, but it has a little fast dip before it rises. This dip is a high-frequency change in current, which induces a large magnetic field in the negative direction. This is exactly the response we see in the AMR. Only after that dip does the exciting current begin to rise, but by the time this happens the dipoles of the AMR are already pointing in the opposite direction and now need to recover. Higher frequency changes in current induce a stronger magnetic field faster and therefore reach the AMR elements first if the current carrying trace only runs underneath the sensor. This behavior is unique to AMRs because they are, in fact, broadband devices, but have until now only shown limited bandwidth behavior for the following reasons:

(1) The magnetic field has been delivered to them in such a way that the high frequency changes have a stronger effect than the low frequency changes, typically, by running a trace only underneath, next to, or on one side of the AMR. The broadest band AMR based sensor by Sensitec, GmbH put the AMR sensor in a U-shaped trace which goes around the perimeter of the sensor. This configuration cancels the perpendicular part of the field, but it does not shield the sensor from noise or concentrate the induced magnetic field onto AMR, and therefore does not increase the response time of the AMR.

(2) Because the AMR is typically not ideally positioned to detect the magnetic field, there is often a substantial signal processing circuit to compensate for the various types of noise, which adds additional delays to the response time of the sensor or device. Because the source of noise was often misinterpreted and the slow response time was attributed to be a property of the AMR, usually bandlimited signal processing circuits (>=1-2 MHz) are used with AMR. In contrast, when the trace is folded around the AMR, within the folded region the induced magnetic field is uniform with respect to frequency and field strength. Therefore, all frequency components arrive at the sensor as generated by the exciting signal. Nonetheless, the results obtained from the experiment using the proposed method show that by amplification and normalization of the field at the sensor's sensitive axis (easy axis), it is possible to achieve higher sensitivity over the linear region of the point-field detector, in this case, AMR. This amplification can also be observed by comparing the steady-state response (low frequency) of the AMR in the "folded trace" with the "standard" configurations.

Figures 1, 13A:
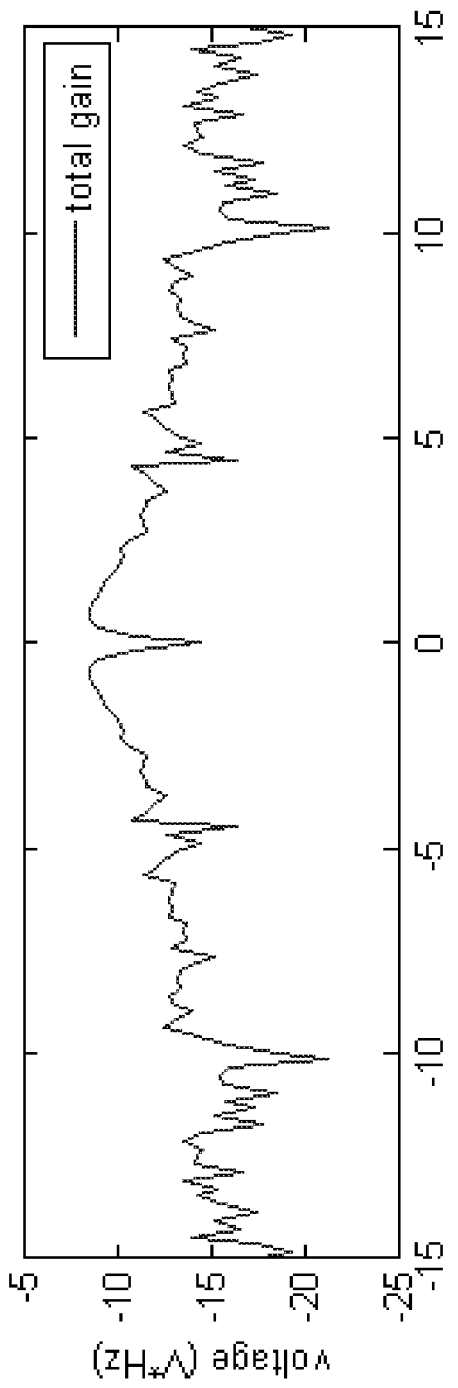
Figures 2, 13A:
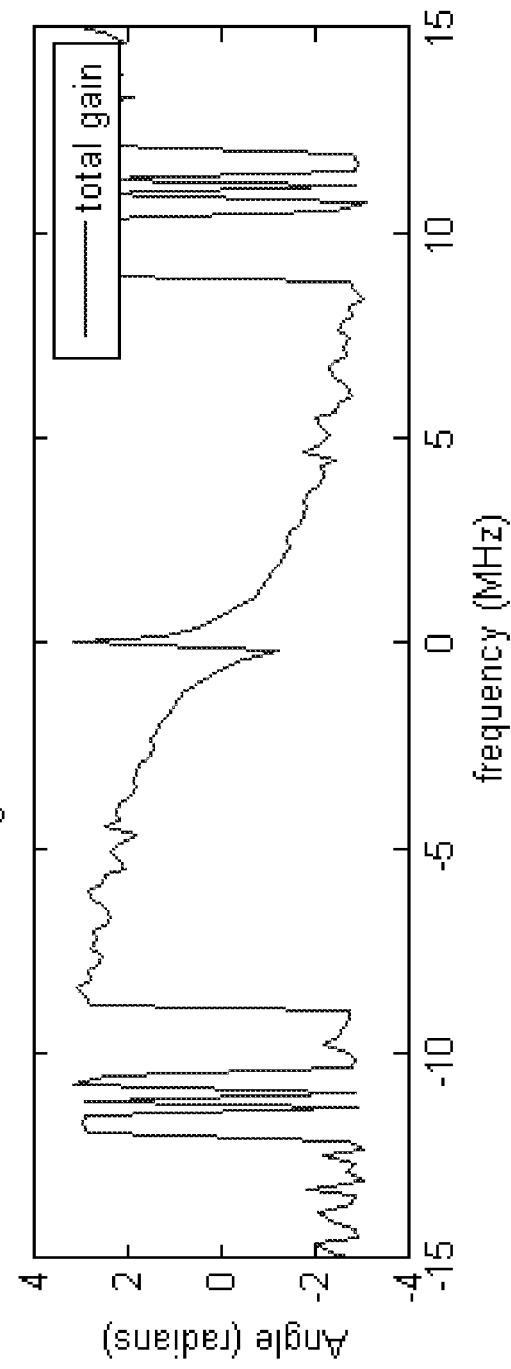
Figures 1, 13B:
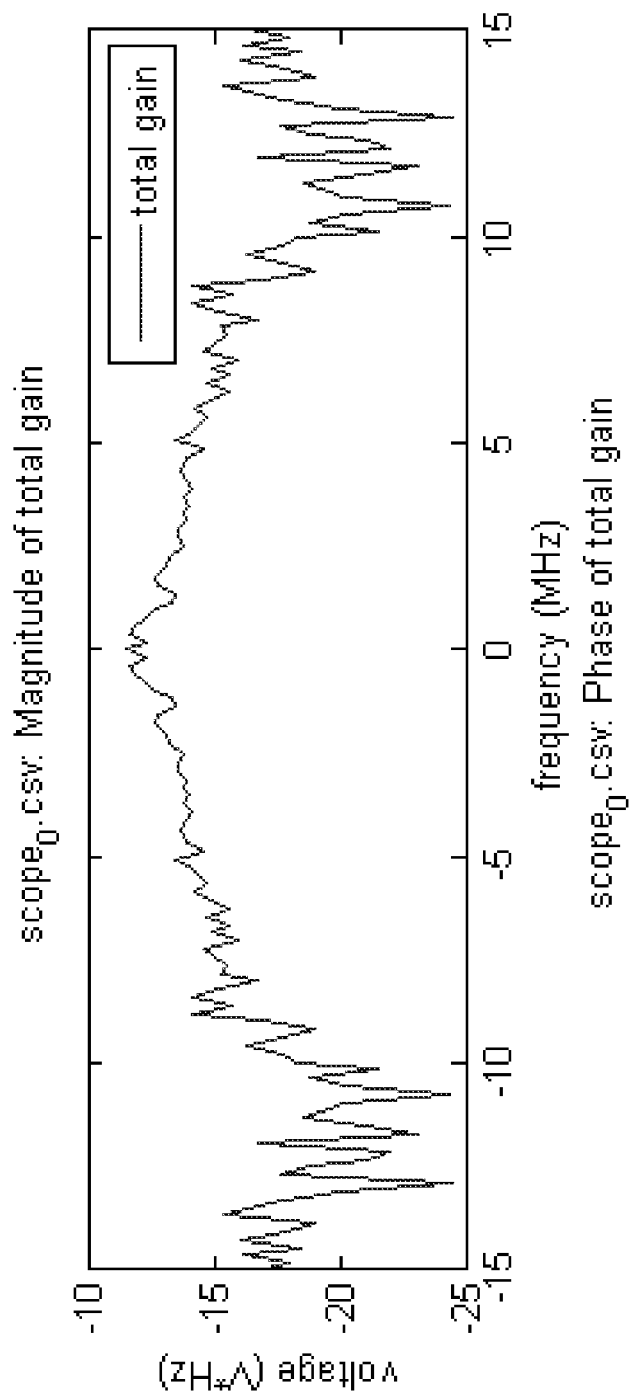
Figures 2, 13B:
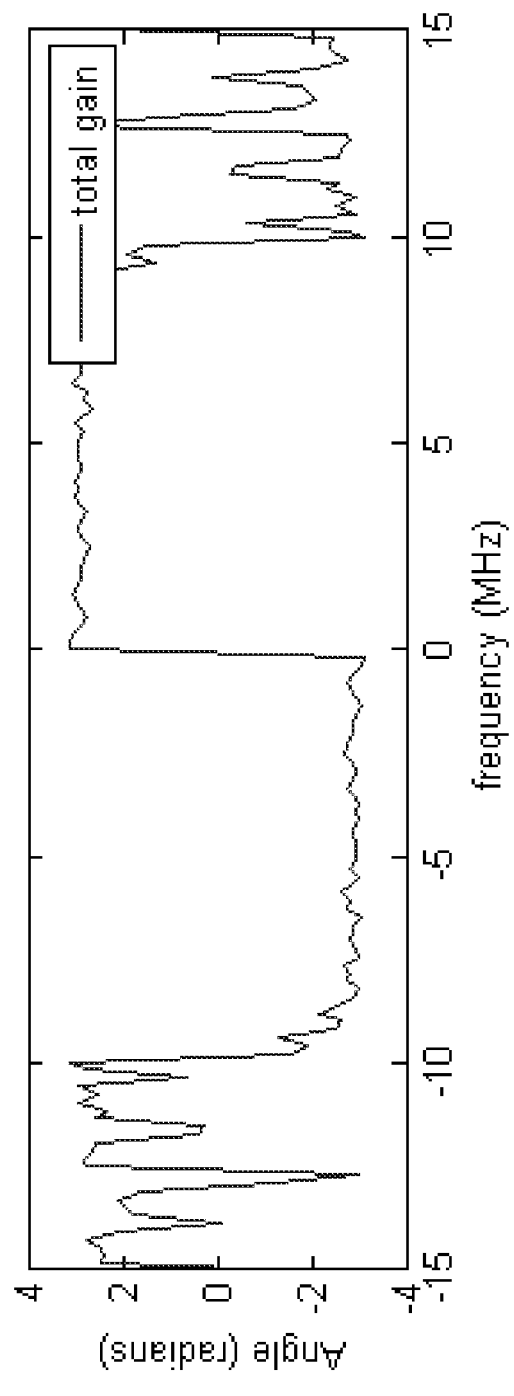

In particular, FIGS. 13a1, 13a2, 13b1, 13b2 present a frequency response analysis for the folded trace configuration and the standard configuration for the experimental results shown in FIG. 12. The difference in detection bandwidth for the sensor is clearly visible in the magnitude response plots of FIGS. 13a1, 13b1. The gain magnitude (FIG. 13b1) for the proposed folded trace method remains more stable for a much higher frequency range than the standard current trace configuration (FIG. 13a1). The folded trace method remains fairly constant up until >10 MHz. The folded trace produces both a broader band response in the AMR with a higher gain. Compare also the FIG. 13a2 phase plot of the standard trace configuration with the FIG. 13b2 phase plot of the folded trace configuration. The proposed method to amplify and make the magnetic field more uniform results in the AMR elements responding in phase and accurately to currents at higher frequencies.

These results lead us to conclude that 1) if the magnetic field is large enough and uniform over frequency, the AMR sensor 100 can detect MHz changes, unlike Hall elements, and 2) isolated magnetic concentrators, such as the proposed folded trace 102', improve the performance and response time of the AMR elements when they are used as contactless current sensors.

Additional Experimental Results

Figure 14:
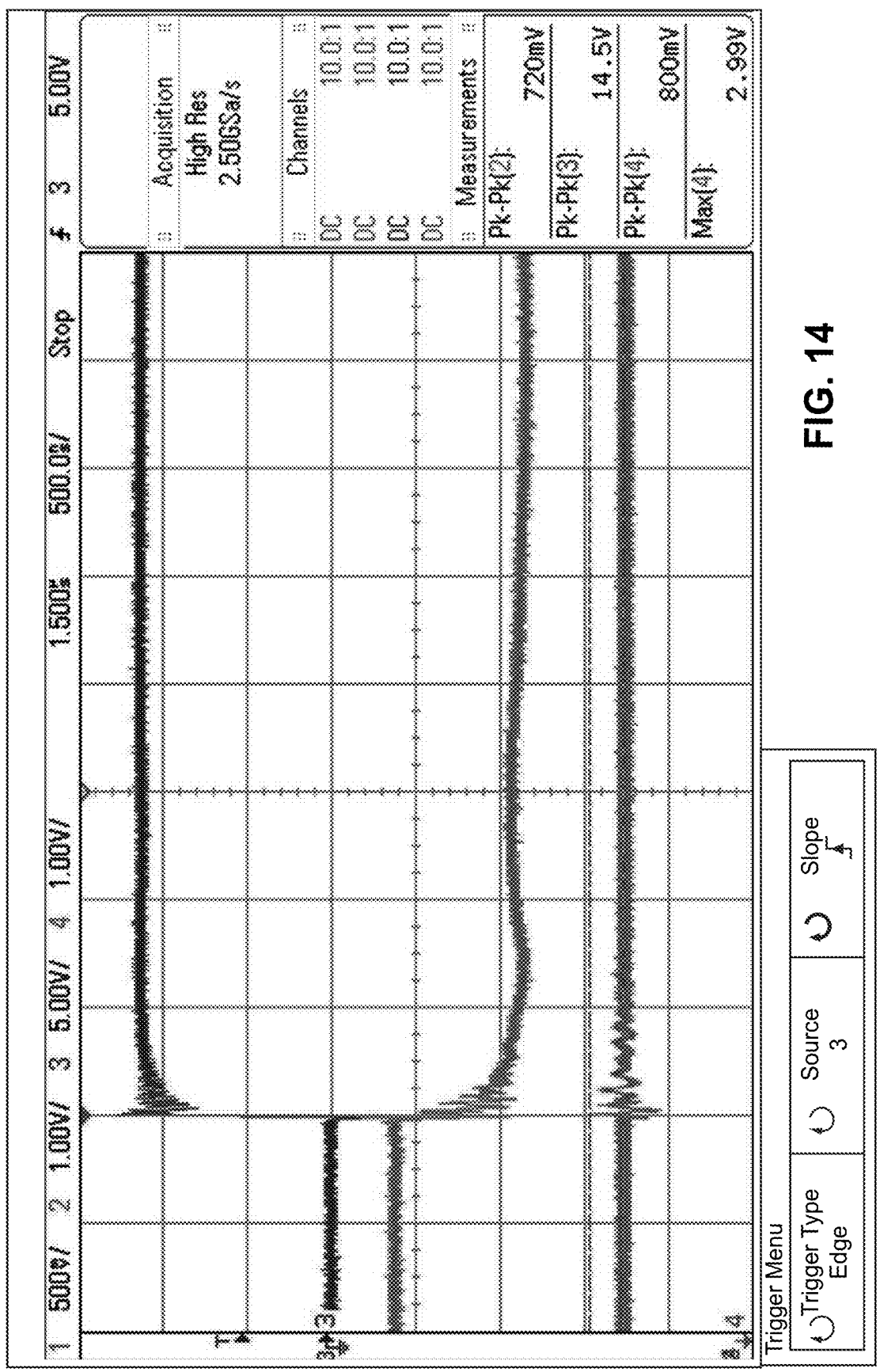
FIG. 14 illustrates an example non-limiting a screenshot from an oscilloscope trace of the step-function (probe 3). The other curves comprise the sensor response triggered by the step-function.
Figure 15:
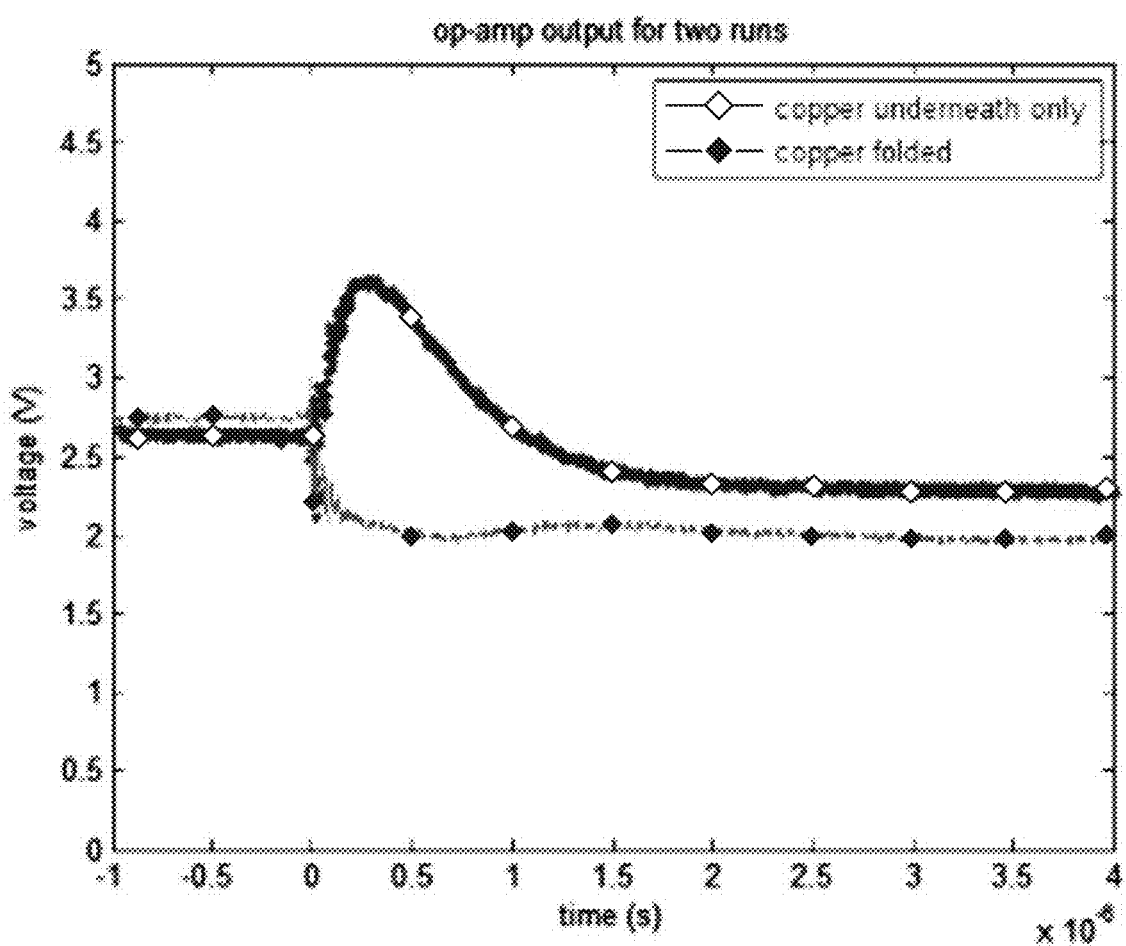
FIG. 15 illustrates an example of amplified output of a magneto-resistive sensor used to detect current when the trace only traveled underneath the sensor (white blocks) and when the trace was wrapped around the sensor (black blocks). Both the response time and the magnitude are improved when the current trace is wrapped around the sensor.
Figure 16A:
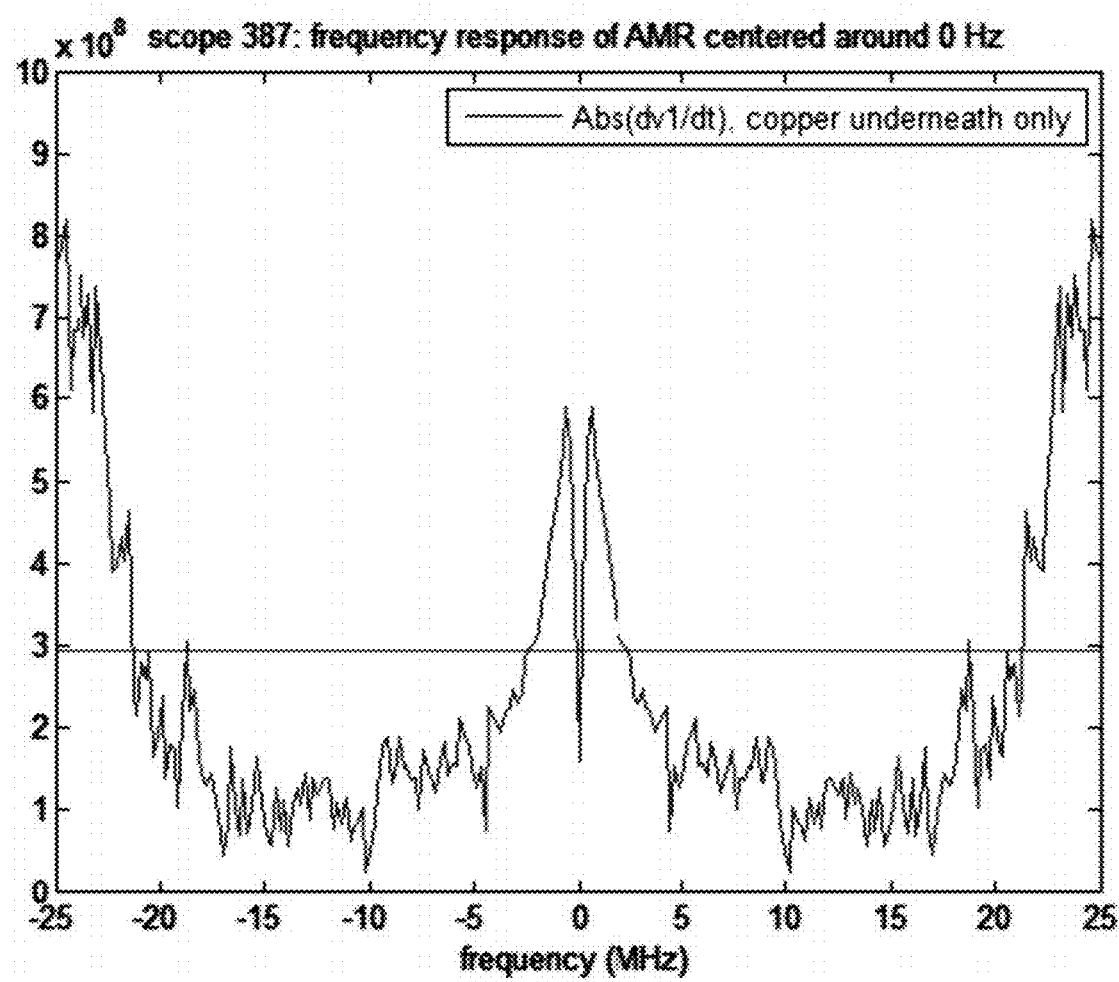
FIGS. 16*a*, 16*b* presents comparison of frequency response using the same sensor with the same excitation pulse with the copper trace only underneath the sensor (FIG. 19*a*) and the copper trace both above and below the sensor (FIG. 19*b*).
Figure 16B:
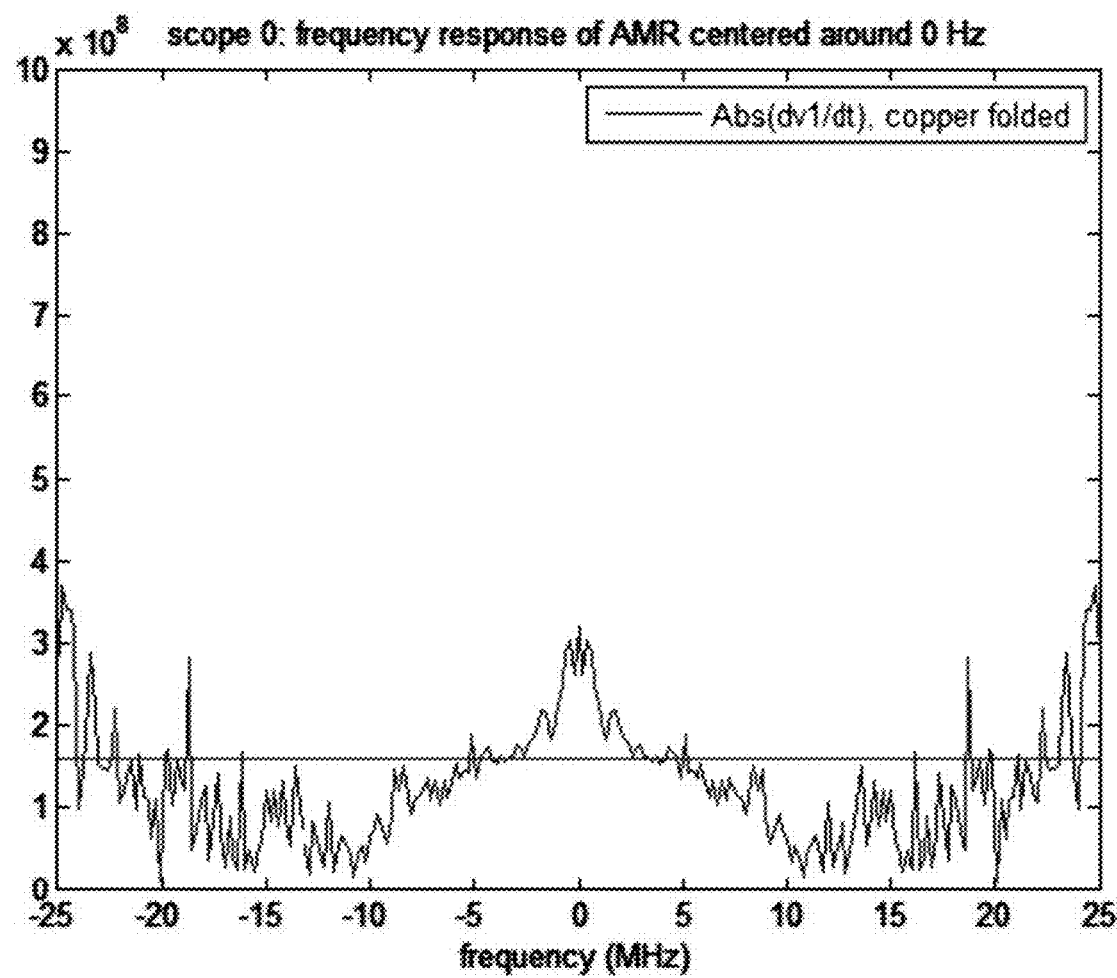

Further data collected from a prototype revealed that the detected voltage signal was approximately doubled, compared to when the sensor was used with the current trace only traveling under the sensor (FIG. 1). A 10 A square pulse with a rise time of ~2.5 ns (50 MHz bandwidth) signal (see FIG. 14) was run through the copper trace detected in the two configurations: (1) The copper trace was positioned only underneath the sensor, and (2) the return of the copper trace was positioned above the sensor as well (FIG. 15). The second configuration enhanced the both the amplitude of the detected signal and the frequency bandwidth the sensor can nominally detect, as evinced by the response time and frequency response. The frequency bandwidth of the output signal is also improved when the copper is wrapped around the sensor (FIGS. 16a, 16b). The frequency response of the sensor used in the configuration where the copper is wrapped around the sensor is much wider and flatter.

Figure 17A:
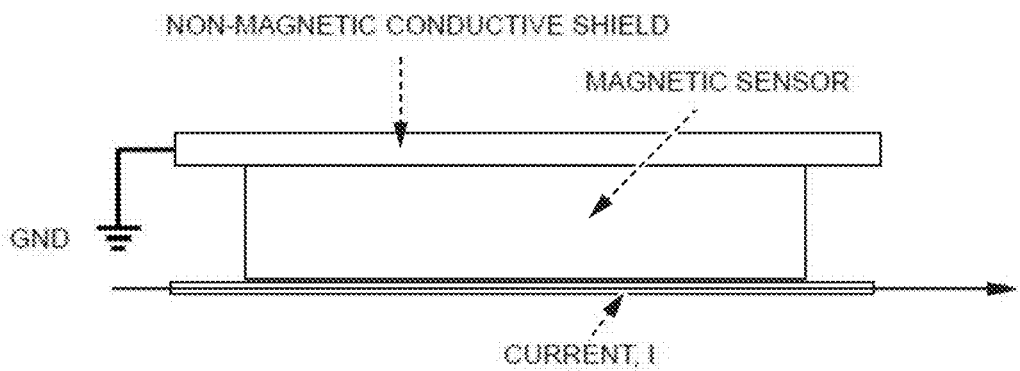
FIGS. 17*a*, 17*b*, 17*c* show example configurations with the current path under magnetic field/current sensor with the nonmagnetic conductive shield only on top of the sensor (FIG. 17*a*), the nonmagnetic conductive shield above and below the current sensor (FIG. 17*b*), and a non-magnetic conductive shield near the current trace under the current trace (FIG. 17*c*). The shields help to concentrate the magnetic field onto sensor, where two are more effective than one.
Figure 17B:
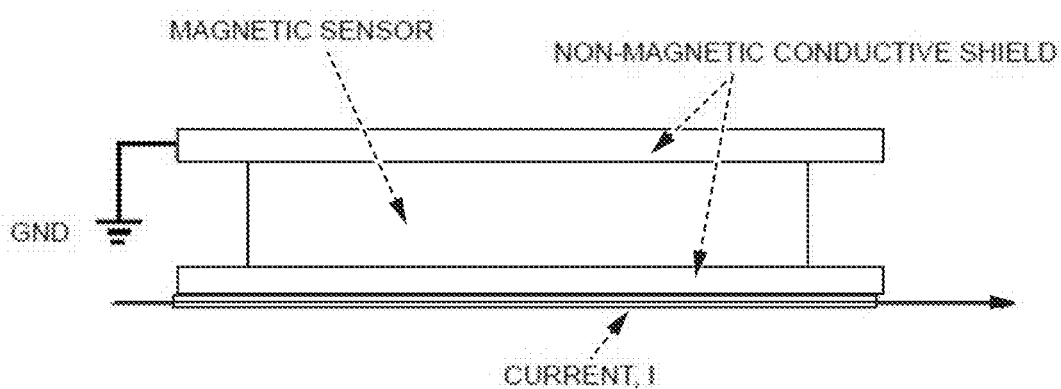
Figure 18:
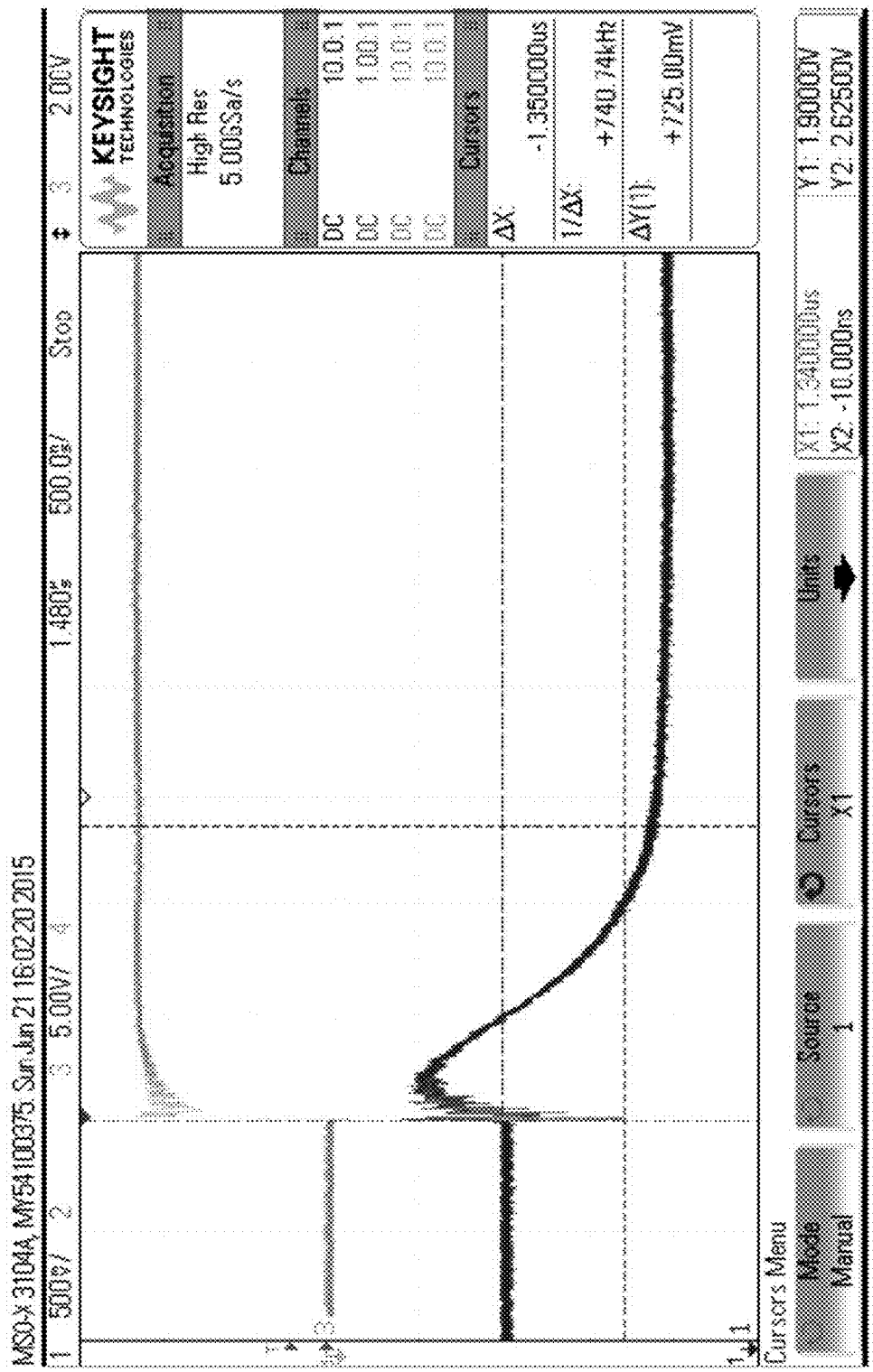
FIG. 18 illustrates an example amplified output of a magneto-resistive sensor used to detect current when the nonmagnetic conductive shield is placed only above the sensor.
Figure 19:
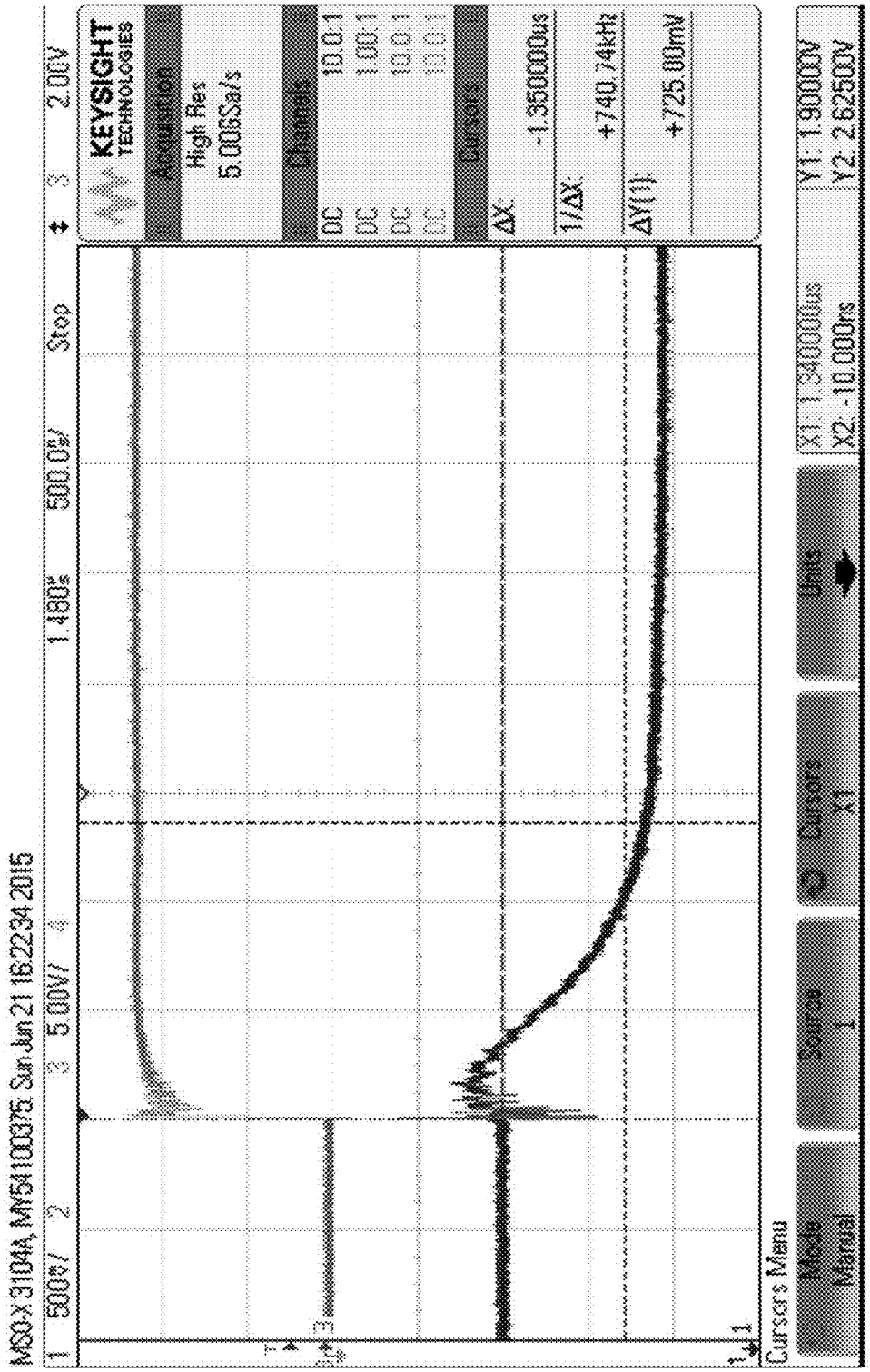
FIG. 19 illustrates an example amplified output of the magneto-resistive sensor used to detect current when a nonmagnetic conductive shield was placed both above and below the sensor. Both the response time and the magnitude are improved when the shields are placed near the sensor. Two shields appear to work better than one.

In particular, data collected from a prototype revealed that the detected voltage signal was enhanced, compared to when the sensor was used with the current trace only traveling under the sensor (FIG. 15). The 10 A square pulse with a rise time of <2.5 ns (50 MHz bandwidth) signal was run through the copper trace detected in two non-limiting illustrative configurations: (1) The nonmagnetic conductive shield was positioned above the sensor, and (2) one nonmagnetic conductive shield was placed both above and below the sensor in FIGS. 17a and 17b, respectively. The second configuration enhanced the both the amplitude of the detected signal and frequency bandwidth the sensor can nominally detect, as evinced by the response time and the fact that the current reaches its steady-state value faster (FIG. 18 and FIG. 19).

FIG. 15 illustrates an example of amplified output of a magneto-resistive sensor used to detect current when (white block) the trace only traveled underneath the sensor and (black block) when the trace was wrapped around the sensor. Both the response time and the magnitude are improved when the current trace is wrapped around the sensor.

Figure 17C:
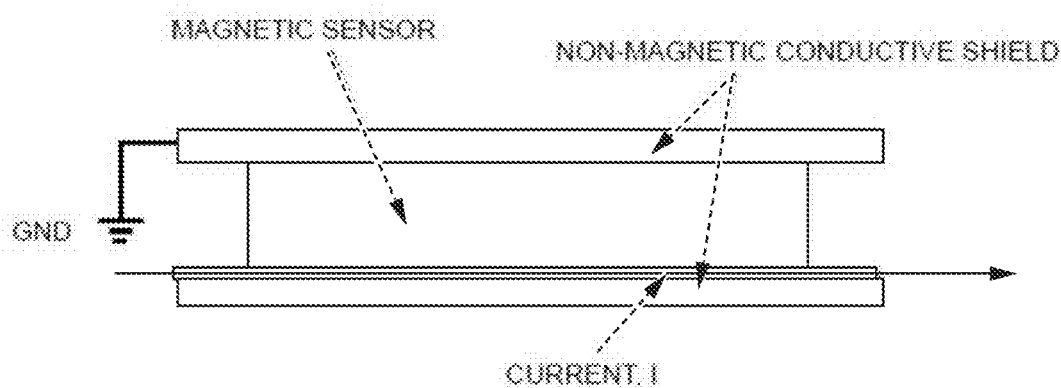

FIGS. 16a, 16b present a comparison of frequency response using the same sensor with the same excitation pulse with the copper trace only underneath the sensor (left) and the copper trace both above and below the sensor (right). FIGS. 17a, 17b, 17c show illustrative non-limiting examples of how a reflective nonmagnetic conductive shield might be used to enhance the field detected by the magnetic field sensor. FIG. 17a shows the use of one shield above the sensor, while FIG. 17b shows the use of two shields, where one is placed above the sensor and the other is placed below the sensor. The shields are connected to the reference ground of the circuit for best performance. FIG. 17c shows a non-magnetic conductive shield near the current trace under the current trace as a second option. FIG. 18 shows the data output of the configuration with one shield shown in FIG. 17a. FIG. 19 shows the data output of the configuration with two shields shown in FIG. 17c.

The terminology used herein is for the purpose of describing particular embodiments only and is not intended to be limiting. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

It will be understood that a number of techniques and steps have been disclosed. Each of these has individual benefit and each can also be used in conjunction with one or more, or in some cases all, of the other disclosed techniques. Accordingly, for the sake of clarity, this description refrains from repeating every possible combination of the individual steps in an unnecessary fashion. Nevertheless, the specification and claims should be read with the understanding that such combinations are entirely within the scope of the invention and the claims.

Thus, while the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A contactless current sensor and conditioning circuit comprising:
    a broadband anisotropic magneto-resistive (AMR) sensing element structured to be disposed in proximity to a current-carrying conductor generating a magnetic field, the AMR sensing element further structured to measure the amount of current flowing through the conductor based on the strength of the magnetic field without requiring electrical contact with the current-carrying conductor, the AMR sensing element providing an output signal at first and second differential output terminals;
    an operational amplifier having first and second differential inputs and an output, the AMR sensing element first and second differential output terminals coupled respectively to the operational amplifier first and second differential inputs;
    the operational amplifier output being connected to the operational amplifier first differential input via a feedback resistor; and
    a voltage divider network connected to the operational amplifier second differential input, wherein the voltage divider network comprises a first resistor connected to the operational amplifier second input, a second resistor connected between the first resistor and ground potential, and a third resistor connected between the first and second resistors and a supply voltage;
    wherein the operational amplifier comprises a high speed component providing wide band amplification of the AMR sensing element output signal with a frequency response of more than 20 MHz.

2. The non-contact current sensor and conditioning circuit of claim 1 wherein the AMR sensing element comprises a magneto-resistor bridge.

3. The non-contact current sensor and conditioning circuit of claim 1 wherein the operational amplifier has a bandwidth in excess of 200 MHz and up to 2 GHz.

4. The non-contact current sensor and conditioning circuit of claim 1 wherein the operational amplifier has a slew rate in excess of 500 volts per microsecond.

5. The non-contact current sensor and conditioning circuit of claim 1 further comprising a voltage regulator and a set/reset switch.

6. The non-contact current sensor and conditioning circuit of claim 1 wherein the current-carrying conductor is at least partially folded or wrapped around the AMR sensing element.

7. The non-contact current sensor and conditioning circuit of claim 1 wherein the operational amplifier has a programmable or adjustable gain.

8. The non-contact current sensor and conditioning circuit of claim 1 wherein the current-carrying conductor covers the AMR sensing element.

9. The non-contact current sensor and conditioning circuit of claim 1 wherein the operational amplifier amplifies and normalizes the magnetic field at the AMR sensor element's sensitive axis to achieve higher sensitivity over a linear region of a point-field detector.

10. The non-contact current sensor and conditioning circuit of claim 1 further including an isolated magnetic concentrator.

11. The non-contact current sensor and conditioning circuit of claim 1 further including a reflective nonmagnetic shield disposed above the AMR sensing element.

12. The non-contact current sensor and conditioning circuit of claim 11 further including a further reflective nonmagnetic shield disposed below the AMR sensing element.

13. The non-contact current sensor and conditioning circuit of claim 1 further including a reflective nonmagnetic shield disposed below the AMR sensing element.

* * * * *